(12) United States Patent
Gupta et al.

(10) Patent No.: US 11,941,334 B1
(45) Date of Patent: Mar. 26, 2024

(54) SYSTEM AND METHOD FOR INTELLIGENT INTENT RECOGNITION BASED ELECTRONIC DESIGN

(71) Applicant: Cadence Design Systems, Inc., San Jose, CA (US)

(72) Inventors: Deepak Gupta, Noida (IN); Hitesh Mohan Kumar, Greater Noida (IN); Yatinder Singh, Puranpur (IN)

(73) Assignee: Cadence Design Systems, Inc., San Jose, CA (US)

( * ) Notice: Subject to any disclaimer, the term of this patent is extended or adjusted under 35 U.S.C. 154(b) by 157 days.

(21) Appl. No.: 17/665,670

(22) Filed: Feb. 7, 2022

(51) Int. Cl.
*G06F 30/31* (2020.01)
*G06F 30/39* (2020.01)
*G06F 40/20* (2020.01)

(52) U.S. Cl.
CPC .............. *G06F 30/31* (2020.01); *G06F 30/39* (2020.01); *G06F 40/20* (2020.01)

(58) Field of Classification Search
CPC ...................................................... G06F 30/31
USPC ......................................................... 716/102
See application file for complete search history.

(56) References Cited

U.S. PATENT DOCUMENTS

2023/0148108 A1* 5/2023 Carlisle, IV .......... G06F 40/284 716/102

\* cited by examiner

*Primary Examiner* — Eric D Lee
(74) *Attorney, Agent, or Firm* — Mark H. Whittenberger, Esq.; Holland & Knight LLP

(57) ABSTRACT

Embodiments include herein are directed towards a system and method for intelligent intent recognition based electronic design. Embodiments may include receiving, using a processor, a natural language input from a user at an intent recognition model. Embodiments may also include performing intent recognition on the natural language input at the intent recognition model and providing an output from the intent recognition model to a command generator. Embodiments may further include generating a command based upon, at least in part, the output and executing the command at a target tool environment.

20 Claims, 31 Drawing Sheets

FIG. 8A

| DRAW WIRE | INVISIBLE | PDF | PACKAGE |
|---|---|---|---|
| Draw Wire with net name clk | MAKING GENERAL PROPERTIES INVISIBLE | | package design |
| Draw a wire with name abc at top left | do not show (nets/property/properties/attribute/attributes) | | package my design |
| draw net wire1 top right | make all properties invisible | A SPECIFIC PAGE | generate netlist |
| Make wire ab bottom left | don't show properties | pdf page 9 | update netlist |
| Draw net ab1 bottom right | MAKING NET NAMES INVISIBLE | {generate/save/create/print} pdf for page 9 | create netlist for design |
| Make wirexyz //draws at centre | make {net/nets/all net} names invisible | print page 7 | netlist the design |
| | do not {display/show} net names | ENTIRE DESIGN | netlist design |
| | select all wires and do not show names | pdf | generate board |
| | don't display net names | {generate/create/save/print} pdf | generate board file |
| | | pdf design | |
| | | pdf {the/this/current} design | |
| | | {generate/create/save/print} pdf for this design | |
| | | save as pdf | |
| | | CURRENT PAGE | |
| | | {generate/create/save/print} pdf for {the} current page | |
| | | pdf this page | |
| | | pdf current page | |
| | | {generate/create/save/print} pdf for {the} current page | |
| | | {generate/create/save/print} pdf for the page opened | |
| | | {generate/create/save/print} pdf for the open page | |
| | | SMART PDF | |
| | | smart pdf //xxx for design | |

SYSTEM AND METHOD FOR INTELLIGENT INTENT RECOGNITION BASED ELECTRONIC DESIGN

FIELD OF THE INVENTION

The present disclosure relates to a system and method for use in electronic design, and more particularly, to an intelligent intent recognition based electronic design creation and approach methodology.

Background

Electronic design connectivity capture and review are the most important and time-consuming process in the printed circuit board ("PCB") cycle. Today, these steps are manual and each step is executed through user inputs using keystrokes or mouse strokes. Electronic design is a complex process and there exists a fair amount of learning cycles for a user to understand tool-specific commands and operations. As such, the user has to manually execute all the rigid and sequential steps to achieve his or her desired result. There is no easy way provided by the tool to capture and execute the user's intent in a seamless way with minimal learning effort.

SUMMARY

In one or more embodiments of the present disclosure, a method for intelligent intent recognition based electronic design is provided. The method may include receiving, using a processor, a natural language input from a user at an intent recognition model. The method may also include performing intent recognition on the natural language input at the intent recognition model and providing an output from the intent recognition model to a command generator. The method may further include generating a command based upon, at least in part, the output and executing the command at a target tool environment.

One or more of the following features may be included. In some embodiments, the method may further include receiving training data at a learning and classification model. The method may also include providing an output from the learning and classification model to the intent recognition model. The intent recognition model may include an intent classifier. The intent recognition model may include an intent entity mapper. The command generator may include a generic command mapper. The command generator may include a tool specific command sequencer and executor. The method may further include providing feedback from the target tool environment back to a user's computing device. The method may also include providing feedback from the intent recognition model to the learning and classification model. The natural language input may be at least one of a speech input and a textual input.

In one or more embodiments of the present disclosure a system for intelligent intent recognition based electronic design is provided. The system may include at least one processor configured to receive a natural language input from a user at an intent recognition model. The at least one processor may be further configured to perform intent recognition on the natural language input at the intent recognition model. The at least one processor may be further configured to provide an output from the intent recognition model to a command generator and to generate a command based upon, at least in part, the output. The at least one processor may be further configured to execute the command at a target tool environment.

One or more of the following features may be included. In some embodiments, the at least one processor may be further configured to receive training data at a learning and classification model. The at least one processor may be further configured to provide an output from the learning and classification model to the intent recognition model. The intent recognition model may include an intent classifier. The intent recognition model may include an intent entity mapper. The command generator may include a generic command mapper. The command generator may include a tool specific command sequencer and executor. The at least one processor may be further configured to provide feedback from the target tool environment back to a user's computing device. The at least one processor may be further configured to provide feedback from the intent recognition model to the learning and classification model. The natural language input may be at least one of a speech input and a textual input.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIGS. 8A-B show a table showing intent recognition examples according to an embodiment of the present disclosure;

FIGS. 21-28 show examples of graphical user interfaces consistent with manual processes.

DETAILED DESCRIPTION

Figure 1:
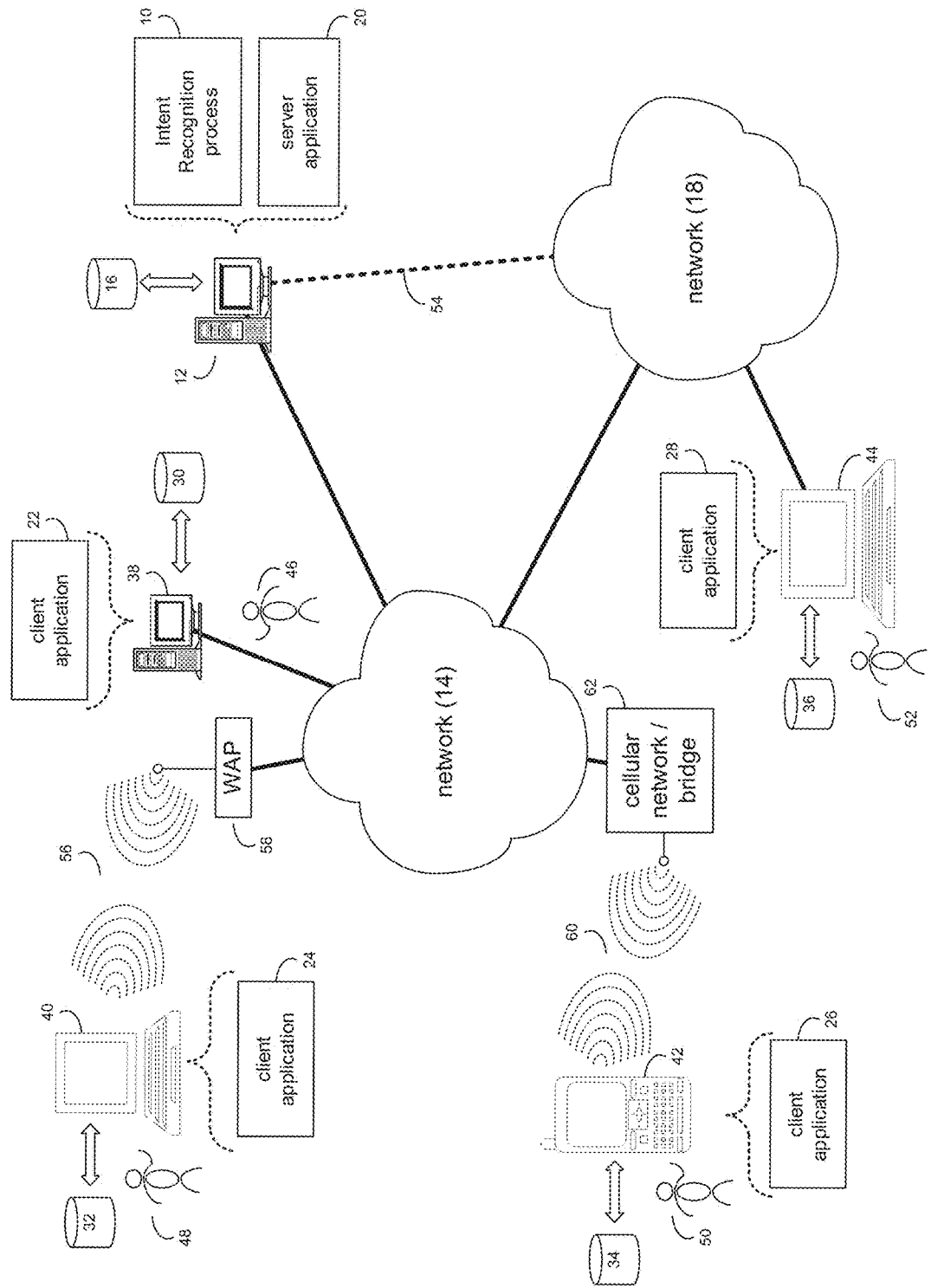
FIG. 1 diagrammatically depicts an intent recognition process coupled to a distributed computing network.

Embodiments included herein may be able to understand the intent of an electronic design tool user as they provide input using any suitable approach. In some embodiments, a natural language input may be received (e.g., speech, text, etc.) and intelligently interpreted. Embodiments may convert this input into associated electronic design terminology and allow for easy execution of various electronic design commands.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

Referring to FIG. 1, there is shown an intent recognition process 10 that may reside on and may he executed by server computer 12, which may he connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™; or Redhat Linux™, for example. Additionally and/or alternatively, intent recognition process 10 may reside on a client electronic device, such as a personal computer, notebook computer, personal digital assistant, or the like.

The instruction sets and subroutines of intent recognition process 10, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS™, Novell Webserver™; or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute intent recognition process 10. Examples of client applications 22, 24, 26, 28 may include, but are not limited to, design verification tools such as those available from the assignee of the present disclosure. These applications may also be executed by server computer 12. In some embodiments, intent recognition process 10 may be a stand-alone application that interfaces with server application or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the intent recognition process may be a client-side application (not shown) residing on one or more client electronic devices 38, 40, 42, 44 (e.g., stored on storage devices 30, 32, 34, 36, respectively). As such, the intent recognition process may be a stand-alone application that interfaces with a client application (e.g., client applications 22, 24, 26, 28), or may be an applet/application that is executed within a client application. As such, the intent recognition process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example.

Users 46, 48, 50, 52 may access server application 20 directly through the device on which the client application (e.g., client applications 22, 24, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, intent recognition process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying, (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40 42 44 may each execute an operating system, examples of which may include but are not limited to Microsoft Windows™, Microsoft Windows CE™, Redhat Linux™, Apple iOS, ANDROID, or a custom operating system.

Figure 2:
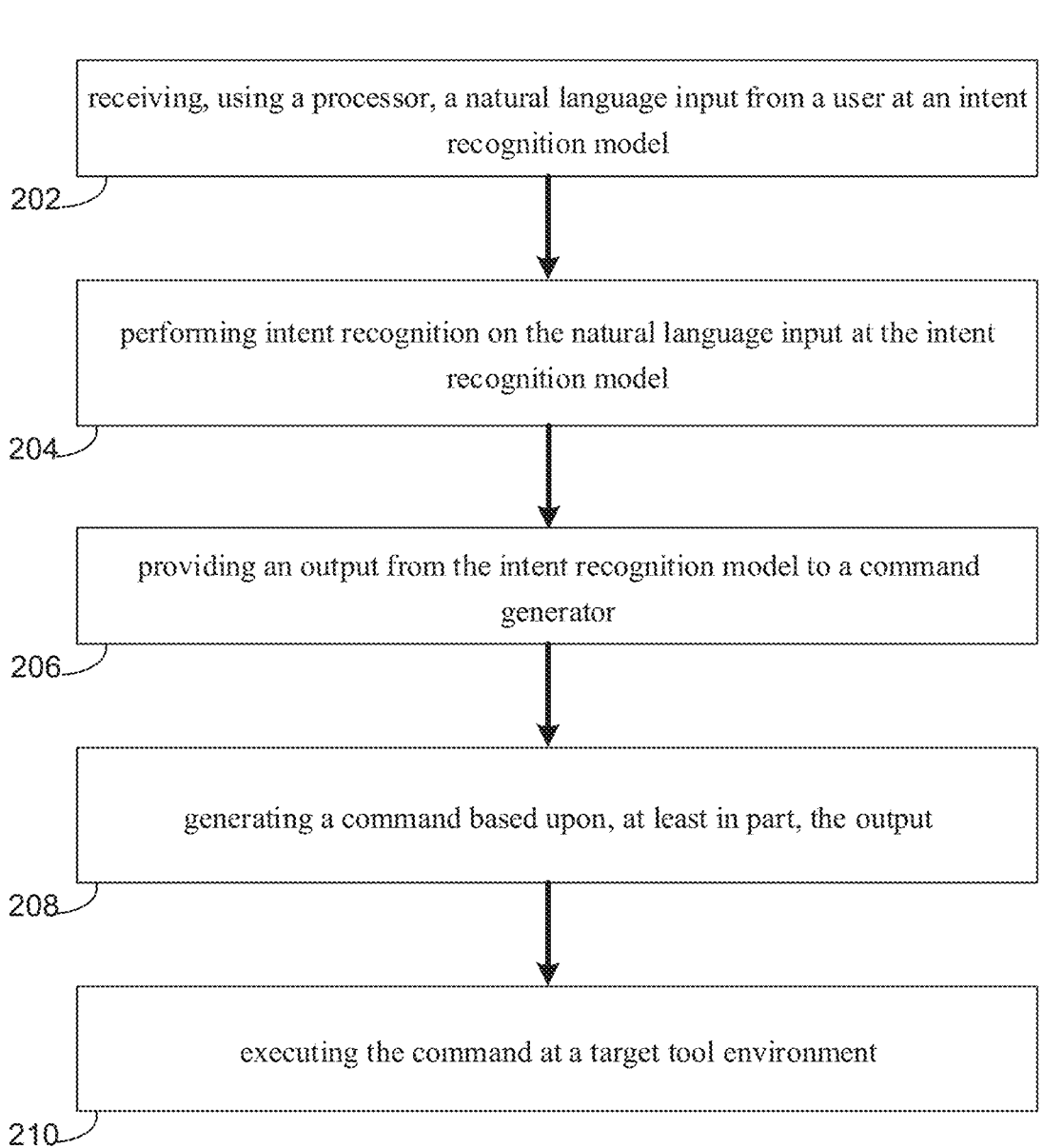
FIG. 2 is an exemplary flowchart of an intent recognition process according to an embodiment of the present disclosure.

Referring now to FIG. 2, a flowchart depicting an embodiment consistent with intent recognition process 10 is provided. The method may include receiving (202), using a processor, a natural language input from a user at an intent recognition model. The method may also include performing (204) intent recognition on the natural language input at the intent recognition model and providing (206) an output from the intent recognition model to a command generator. The method may further include generating (208) a command based upon, at least in part, the output and executing (210) the command at a target tool environment. Numerous other operations are also within the scope of the present disclosure.

Figure 3:
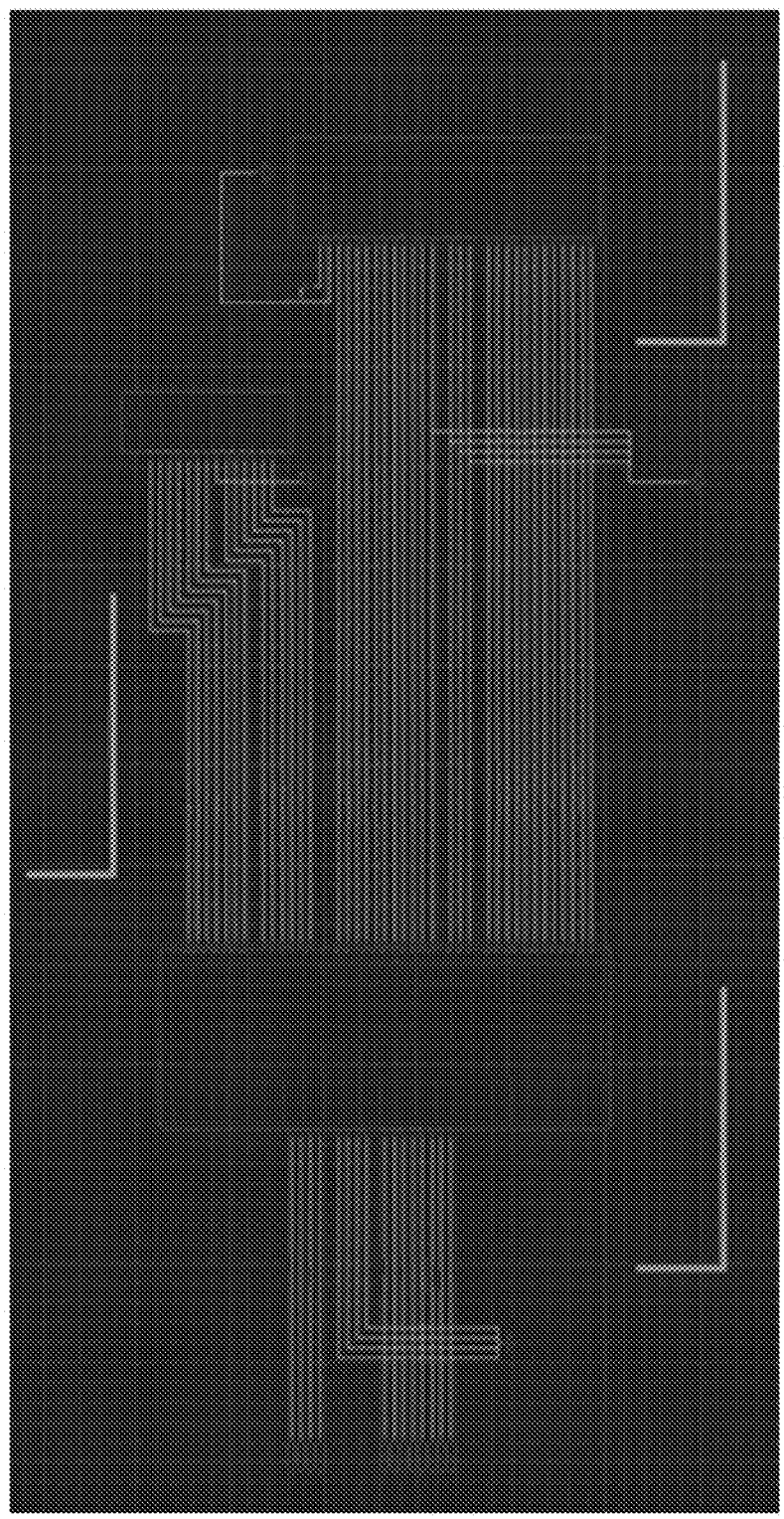
FIGS. 3-4 show graphical user interfaces showing examples associated with an intent recognition process according to an embodiment of the present disclosure.
Figure 4:
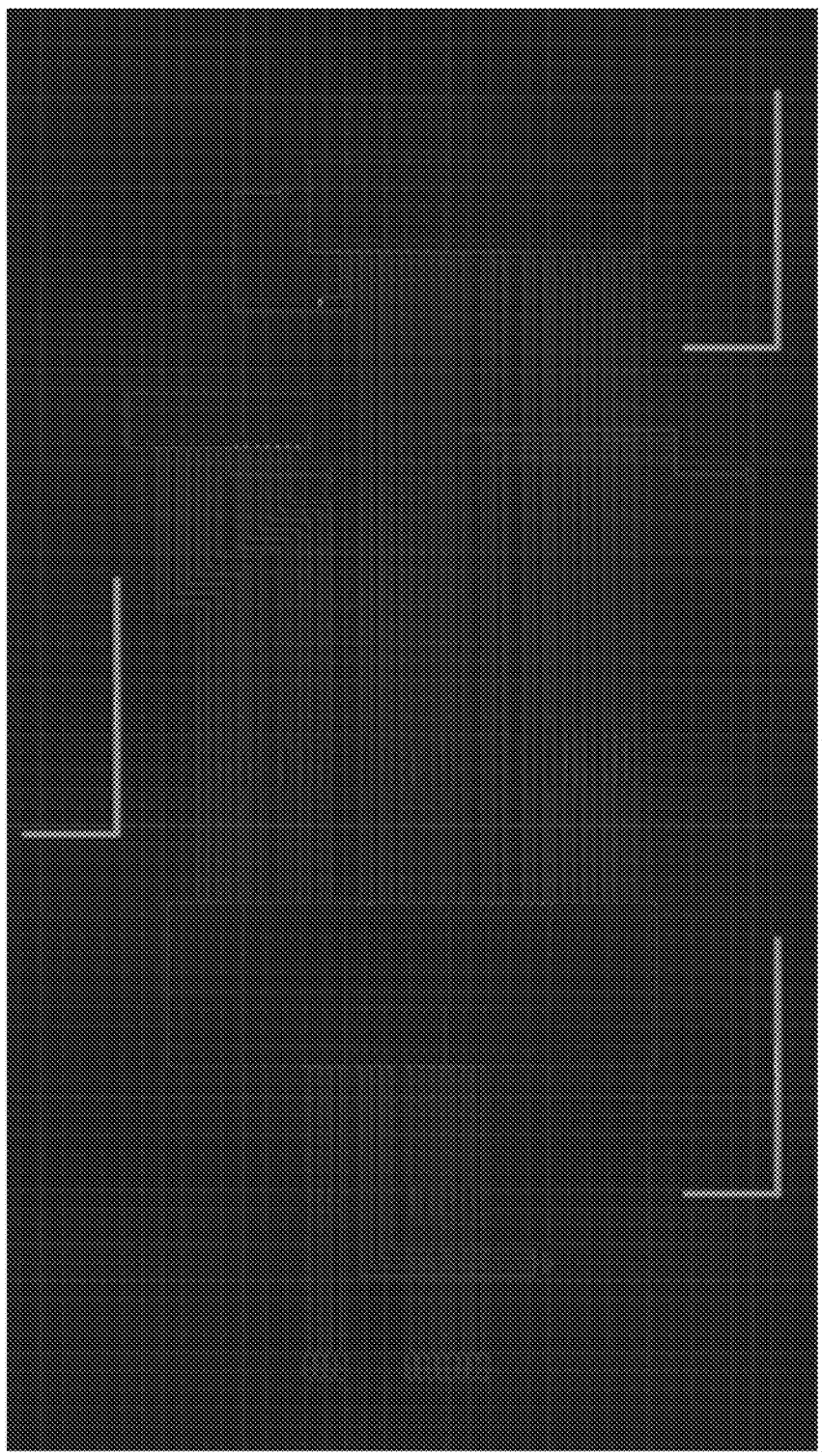

Referring now to FIGS. 3-4, graphical user interfaces 300, 400 showing example electronic designs are provided. In this particular example, the user may intend to change the colors of the wires shown in FIG. 3 (originally in yellow) to a green color in FIG. 4. Using existing approaches, the user has to perform all of the required steps sequentially and manually. In this way, the user may create scripts and encapsulate commands to execute which is a tedious and non auto-scalable manual method. The particular intention here is to change the color of all of the wires to green. The manual steps of applying one or more filters, selecting all wires, selecting the correct color, etc. may all be required.

Figure 5:
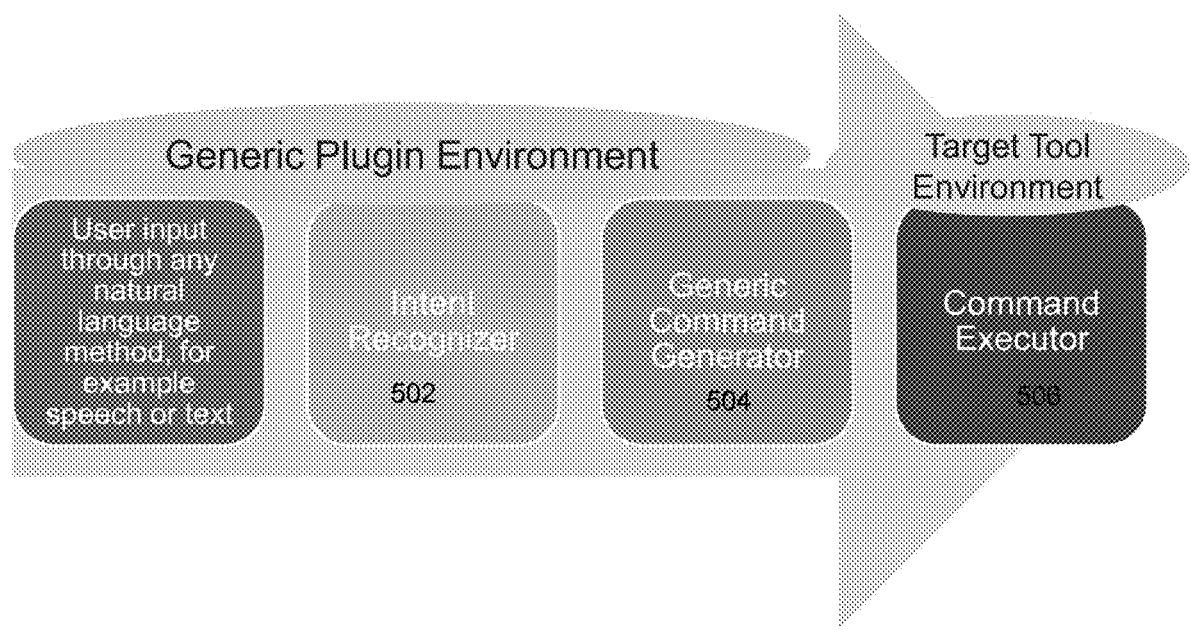
FIG. 5 is an exemplary flowchart of an intent recognition process according to an embodiment of the present disclosure.

Referring now to FIG. 5, a flowchart 500 consistent with embodiments of intent recognition process 10 is provided. The process may include an intelligent intent recognition system that interprets the designer's intent received through any natural language method. Some of these may include, but are not limited to speech or text, and then achieve that intent through automatic execution of a sequence of operations.

In some embodiments, the intent recognition method may utilize context-aware and language construct intelligence methodologies. Intent recognizer 502 may be configured to receive a user input (e.g. using a voice recognition engine), interpret the intent and provide the intent output to generic command generator 504. Command generator 504 may be configured to generate a sequence of operation commands and provide them to command executor 506. Command executor 506 may execute the commands in the target design environment to achieve the result and also provide feedback to the designer.

Figure 6:
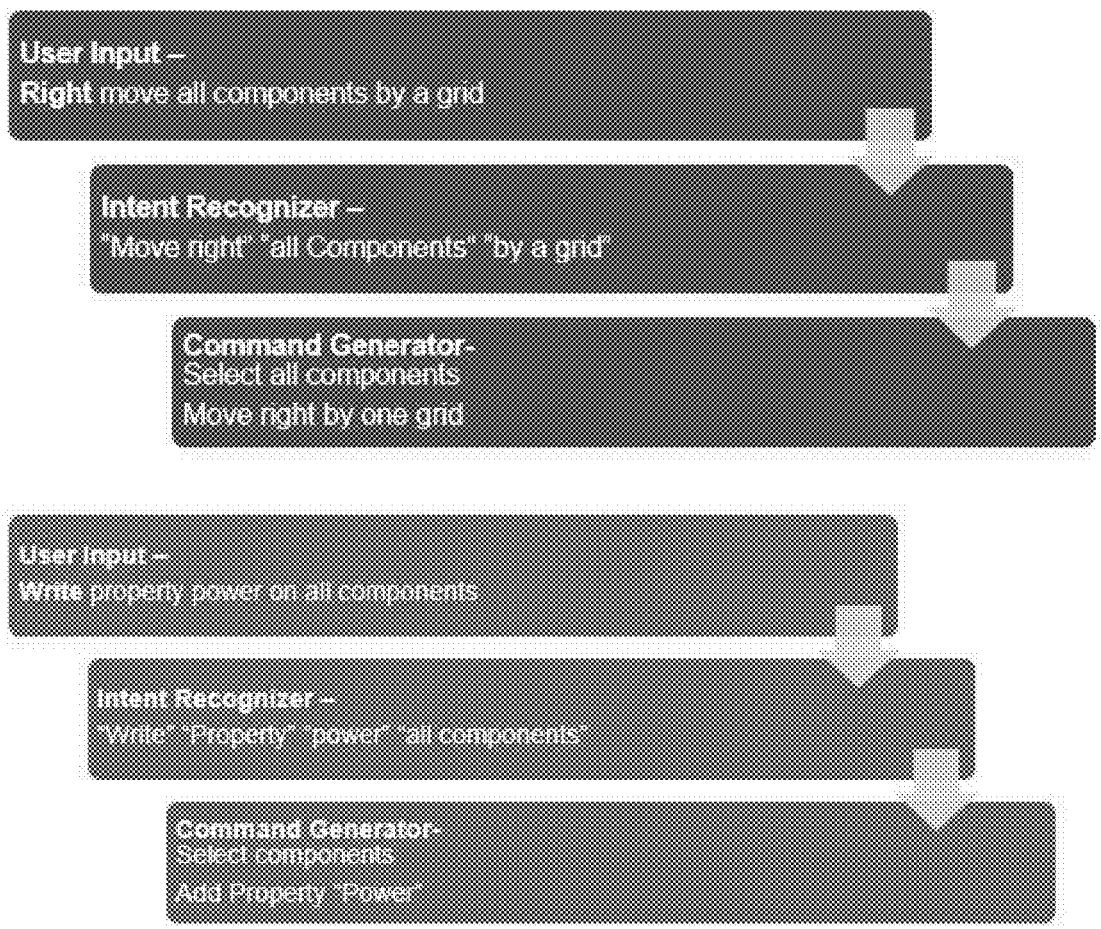
FIG. 6 is another exemplary flowchart of an intent recognition process according to an embodiment of the present disclosure.

Referring now to FIG. 6, an embodiment showing a flowchart depicting an example of context aware intelligence is provided. Context aware intelligence may be utilized to interpret the intent in context. For example, the pronunciation of "write" and "right" are equivalent. However, intent recognizer 502 may be configured to intelligently understand whether the term is "right" or "write" based upon the context. For example, if the input is "right move all components by a grid" intent recognizer 502 may recognize the term as "right". In contrast, if the input is "write property power on all components" intent recognizer 502 may recognize the term as write. Due to the context aware intent recognition system, in the first example, the context of "move" and "by a grid" determines the intent as move "right". In the second example, the context of "property" and "all components" determines the intent as "write".

In some embodiments, language construct intelligence may also be utilized. Language construct intelligence may be used to interpret the intent using the power of language constructs. For example, if a user needs to move all of the components of a design to the right by one grid, there may be various possibilities:

Case 1—"Right move all components by a grid"
Case 2—"Move right all components by a grid"
Case 3—"Move all components right by a grid"
Case 4—"Move all components right by one grid"
Case 5—"All components move right by one grid"
Case 6—"Shift complete circuit to right"
Case 7—"Shift my circuit a little towards right"
Case 8—"Drag circuit to right"

In all of the above cases, regardless of the order of words or phrases, intent recognition process 10 may intelligently recognize the following intents:

1. "Move Right"
2. "All Components", "Complete Electric Circuit"
3. "By a grid"

Figure 7:
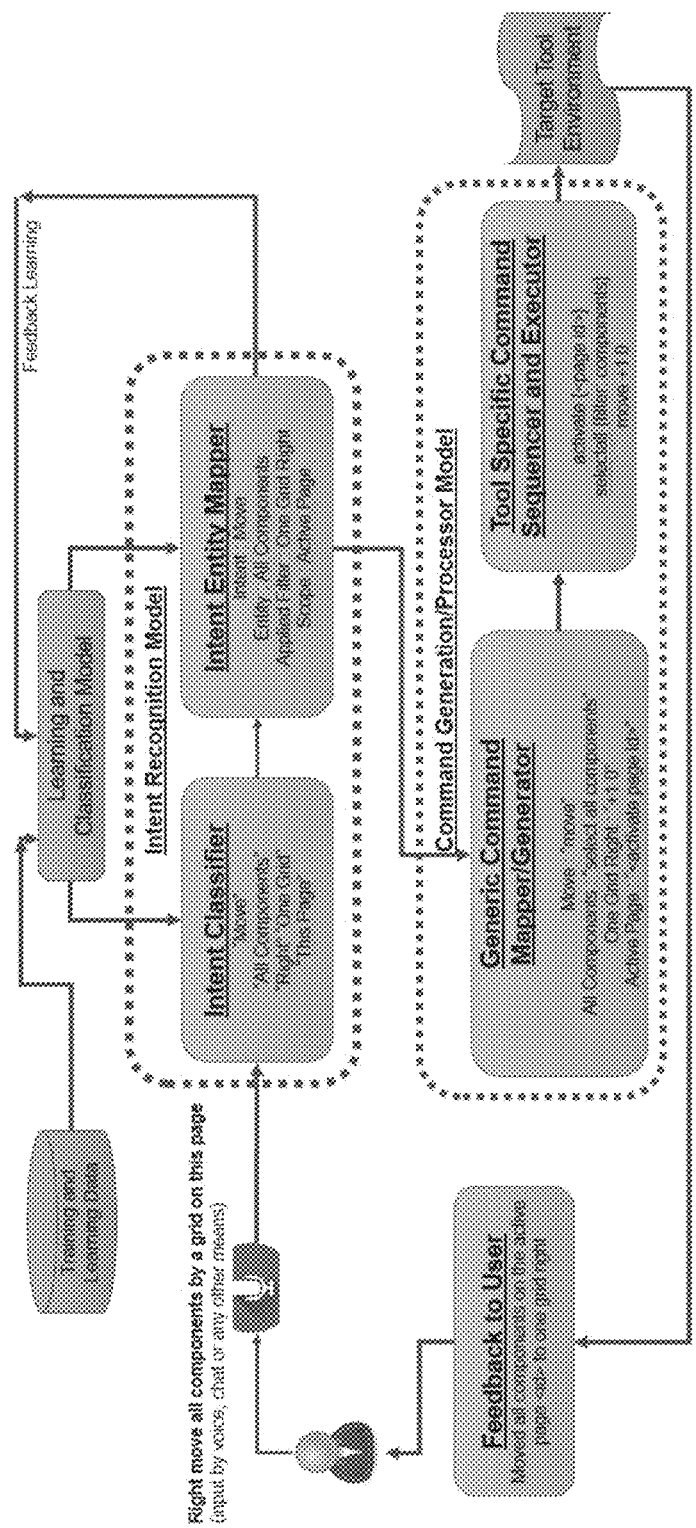
FIG. 7 is another exemplary flowchart of an intent recognition process according to an embodiment of the present disclosure.

Referring now to FIG. 7, an embodiment showing a diagram 700 consistent with intent recognition process 10 is provided. As shown, an input may be received at an intent recognition model, which may include an intent classifier and an intent entity mapper. Training data may be provided to a learning and classification model, which may be configured to receive feedback learning from intent recognition model. The intent entity mapper may provide an output to a command generation and processor model, which may include a generic command mapper/generator and a tool specific command sequencer and executor. Command generation model may cause the execution of the command at the target tool environment and feedback may be provided to the user.

In some embodiments, the intent classifier may be configured to receive an input in a natural language, break it into keywords, filter the noise, apply the context to keywords to remove ambiguities (e.g., classifies them) and then output the intent to the intent entity mapper module. For example, upon receiving the natural language input "right move all components by a grid on this page", the intent classifier may first breaks into the keywords—"Right or Write" (no context applied yet, hence both are equal candidates), "move", "all components", "a grid", "this page", then apply the context to it. In this example, "move" and "a grid" are the contexts which classify "right or write" as "right" and not "write". As the output, the intent classifier provides the following intent to intent entity mapper module as its input—"right", "move", "all components", "a grid", "this page", etc.

In some embodiments, the intent entity mapper may be configured to receive one or more inputs in the form of intent from the intent classifier and map them to the execution enabled entities. The intent entity mapper may then output the execution entities to the generic command mapper module. For example, upon receiving the intent—"right", "move", "all components", "a grid", "this page" from the intent classifier, the intent entity mapper may be configured to map them as follows—"move" mapped to the operation intent, "all components" mapped to operation entity objects, "a/one grid" and "right" mapped to operation filter and "this page" mapped to the operation scope.

In some embodiments, the generic command mapper may be configured to receive one or more execution entities from the intent entity mapper, convert them to logically , understandable generic (tool agnostic) execution statements by the computer and then output the logically understandable execution statements to the tool specific command sequencer and executor. For example, upon receiving the mapped execution enabled entities "move" as the operation intent, "all components" as operation entity objects, "a/one grid" and "right" as operation filter and "this page" as operation scope, the generic command mapper may map "move" as "move", "all components" as "select all components", "a/one grid" and "right" as "+1 0", i.e. positive x direction by one grid, and "this page" as "active page".

In some embodiments, the tool specific command sequencer and executor may be configured to receive logically understandable generic (tool agnostic) execution statements from the generic command mapper and then convert that into the specific tool's actual commands in a sequence of steps. It then provides the sequence of the commands to the tool specific corn and executor. For example, upon receiving the generic commands as "move", "select all components", "+1 0" and "active page", the sequencer and executor may be configured to sequence and generate one or more tool specific commands. Some of these may include, but are not limited to, "activate <active page id>; selectall {filter: components}; move +1 0". This module then provides these three sequenced commands to the actual tool execution environment.

In some embodiments, the feedback may be displayed to the user using any suitable approach. Accordingly, the finally executed command may he displayed to the user to provide visual feedback. For example, after the operation completion, the following feedback message may be displayed to the user ("Moved all components on the active page by one grid right").

Figure 8A:
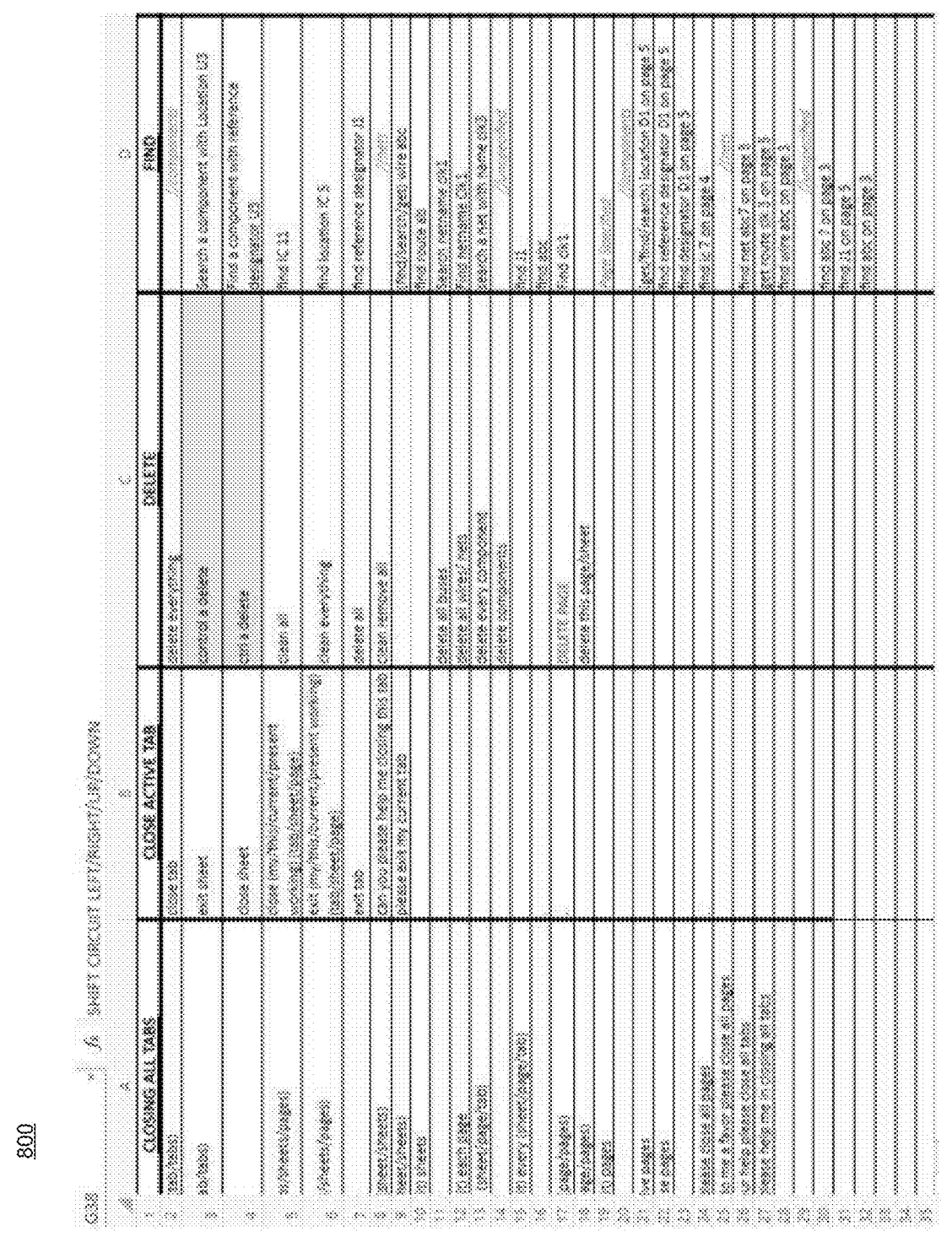

Referring now to FIGS. 8A-B, embodiments showing a table 800 consistent with intent recognition process 10 is provided. Table 800 depicts a number of example commands and the associated user intents that may be associated with the commands.

Figure 9:
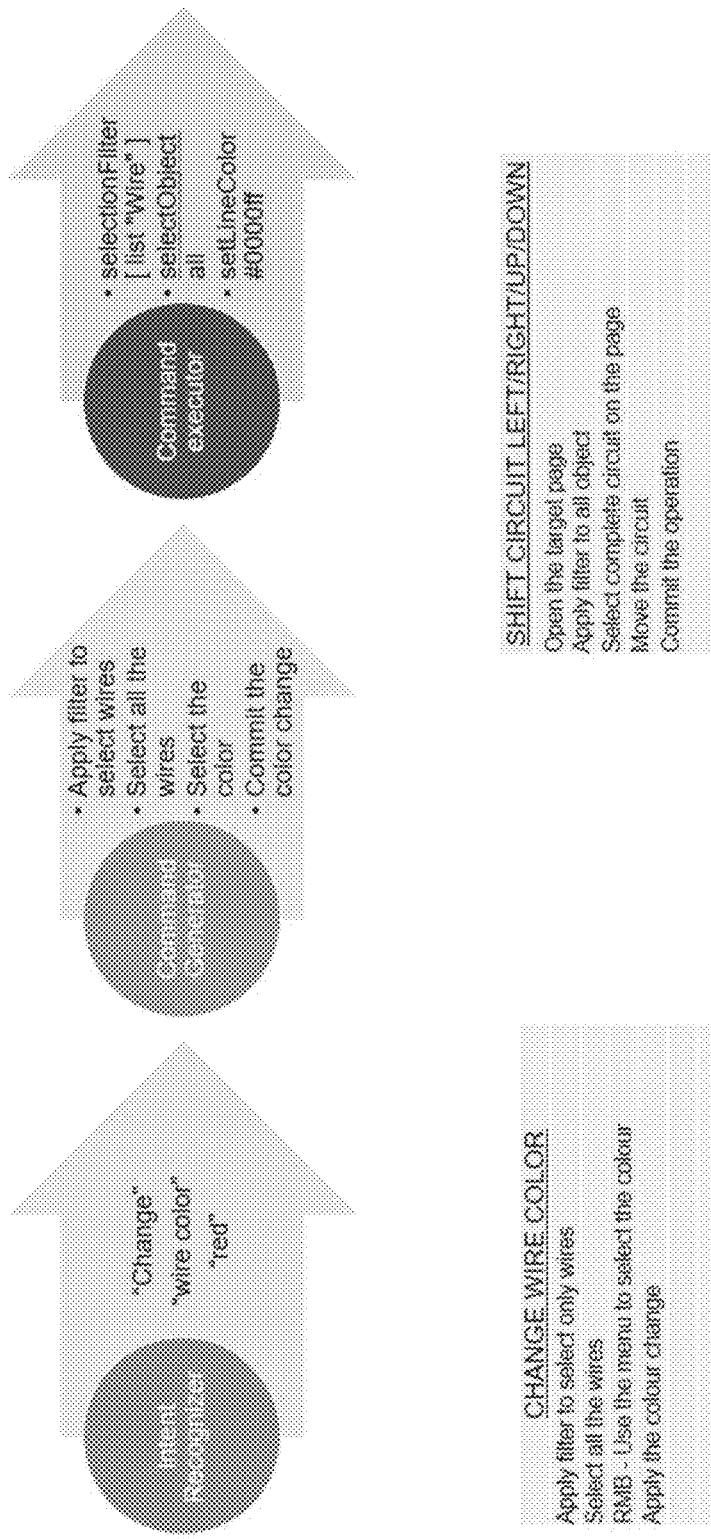
FIG. 9 is another exemplary flowchart of an intent recognition process according to an embodiment of the present disclosure.

Referring now to FIG. 9, an embodiment showing a diagram 900 consistent with intent recognition process 10 is provided. In this example, the input is "change the wire color to red". FIG. 9 also shows yet another possible example wherein the input in this particular case is "shift circuit left/right/up/down". Numerous inputs are within the scope of the present disclosure and the particular inputs discussed herein are provided merely by way of example.

Figure 10:
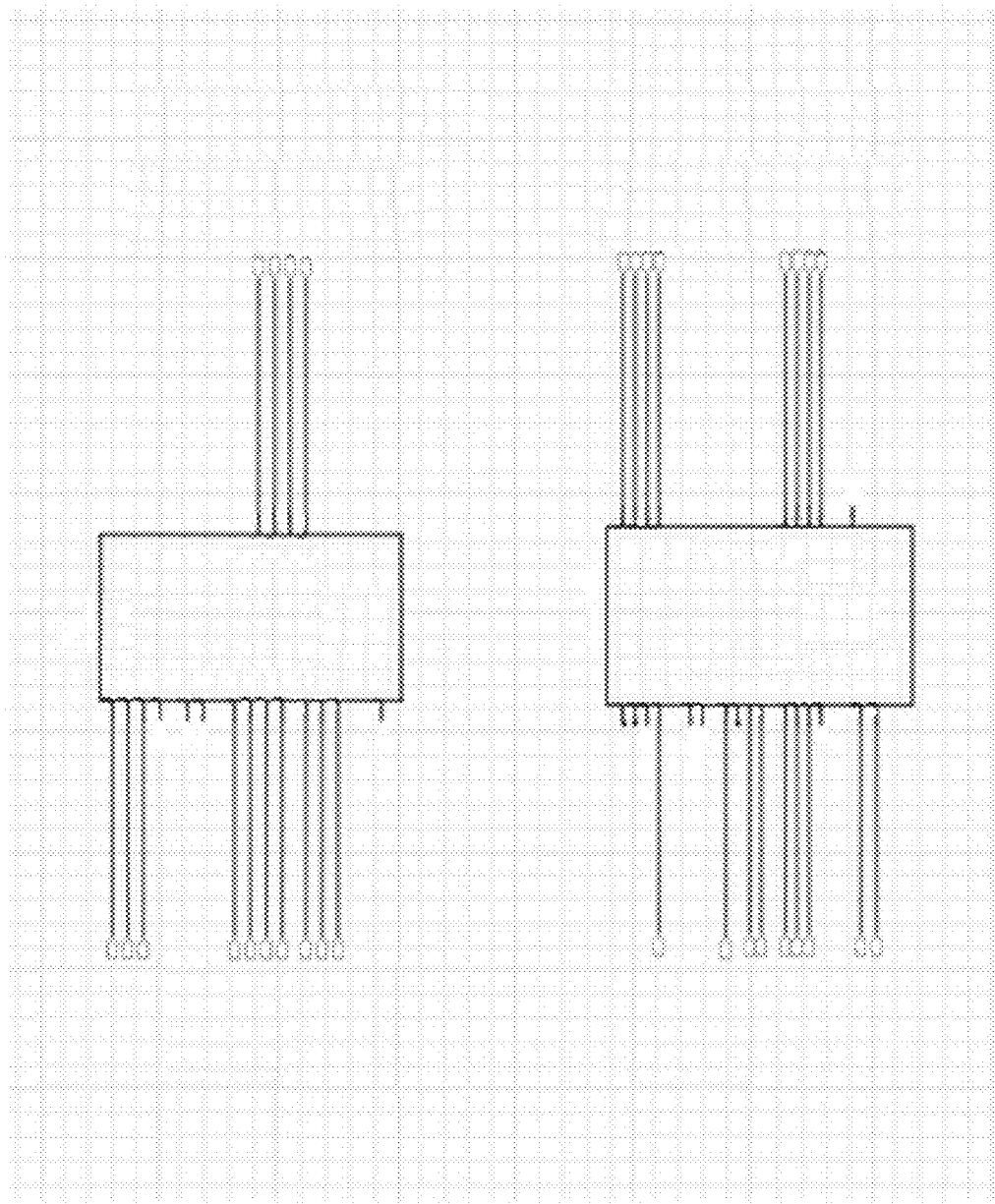
FIGS. 10-16 show examples of graphical user interfaces consistent with manual processes.
Figure 11:
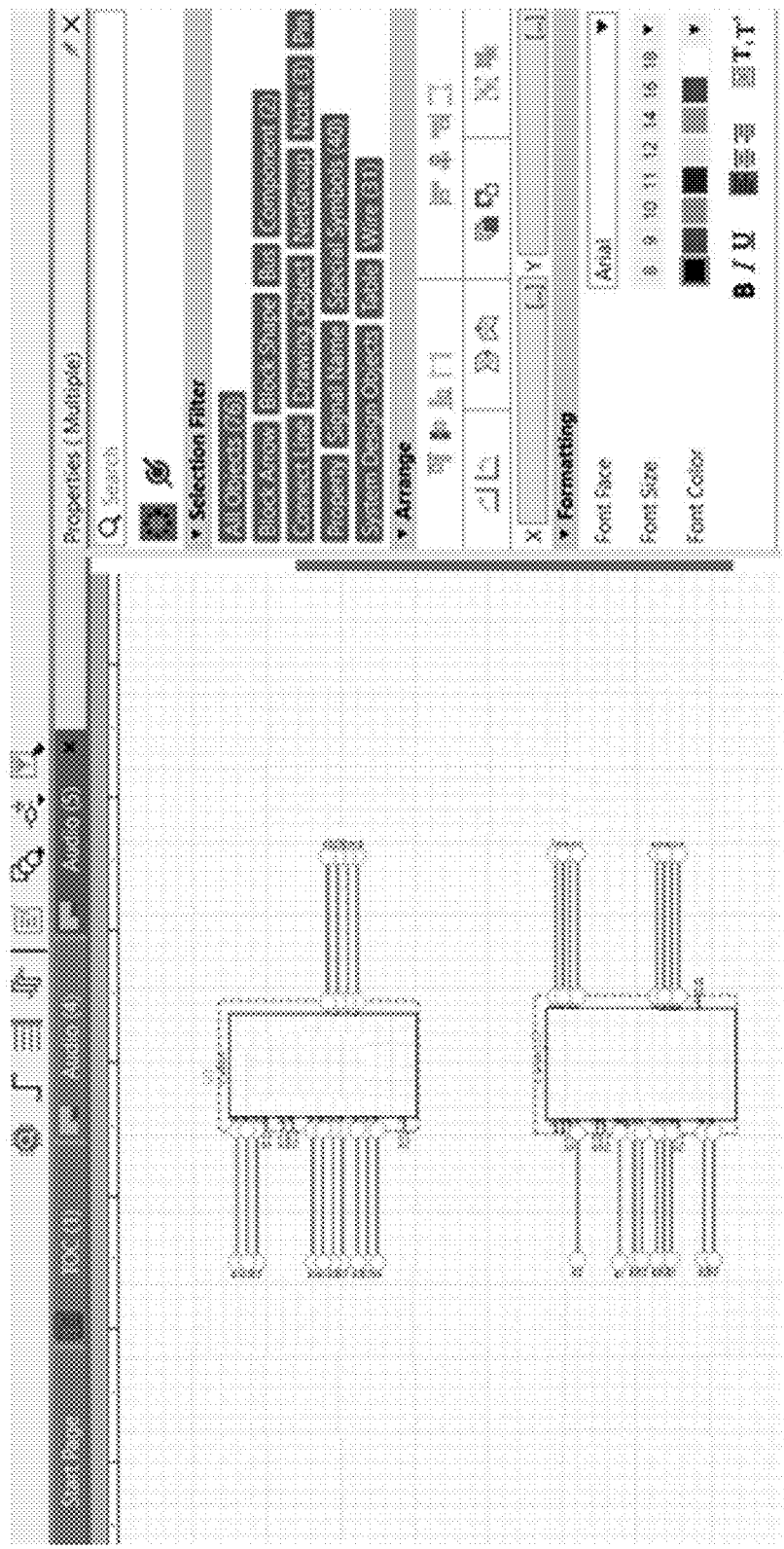
Figure 12:
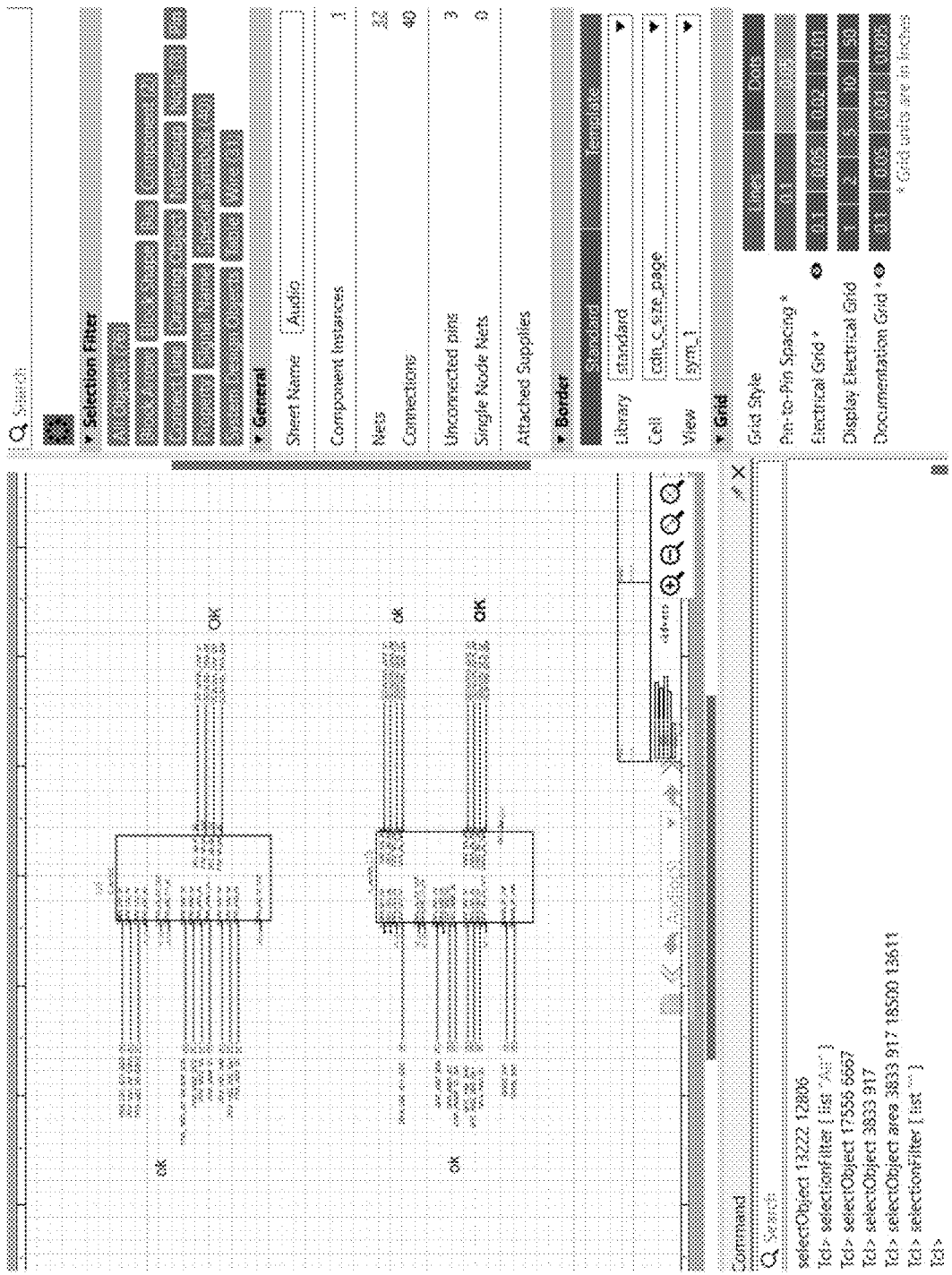
Figure 13:
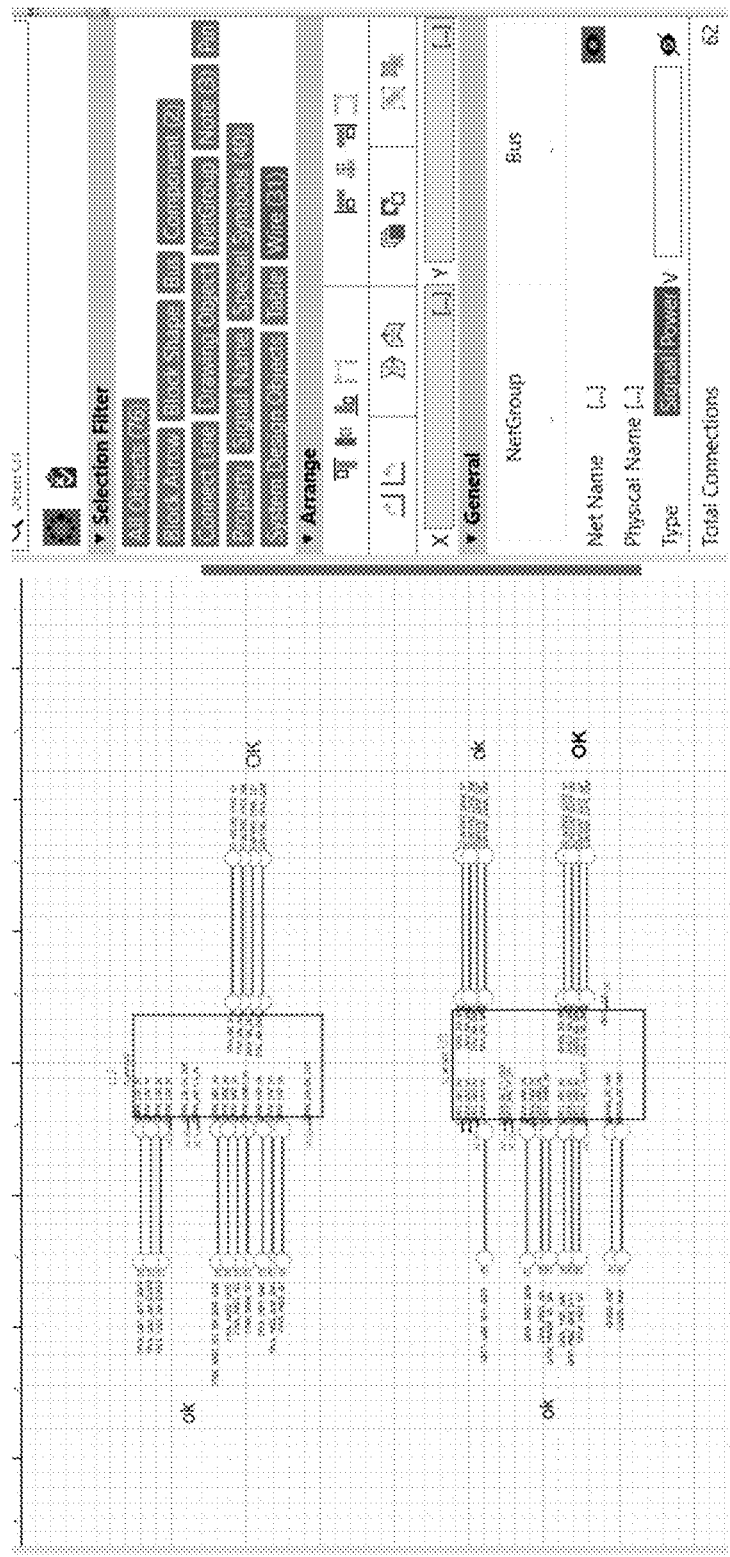
Figure 14:
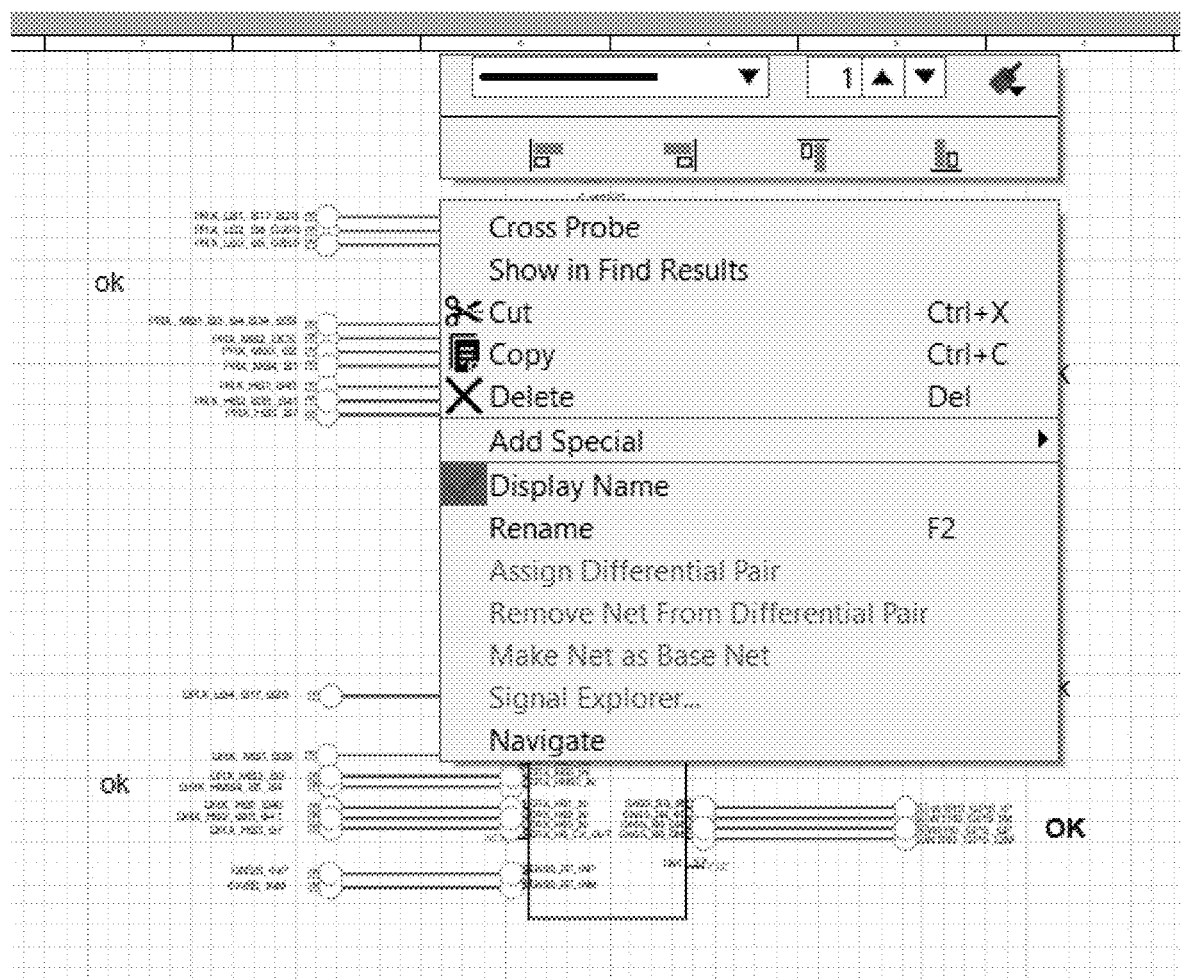
Figure 15:
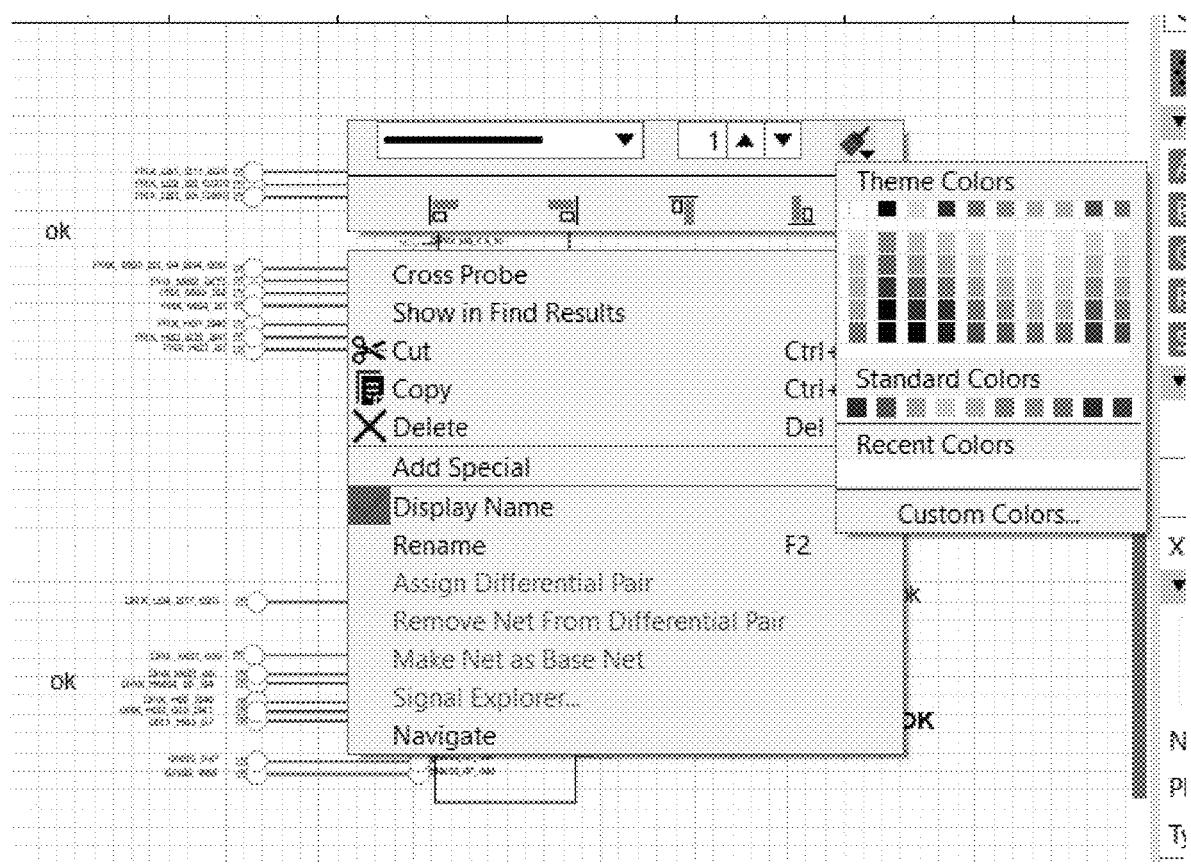
Figure 16:
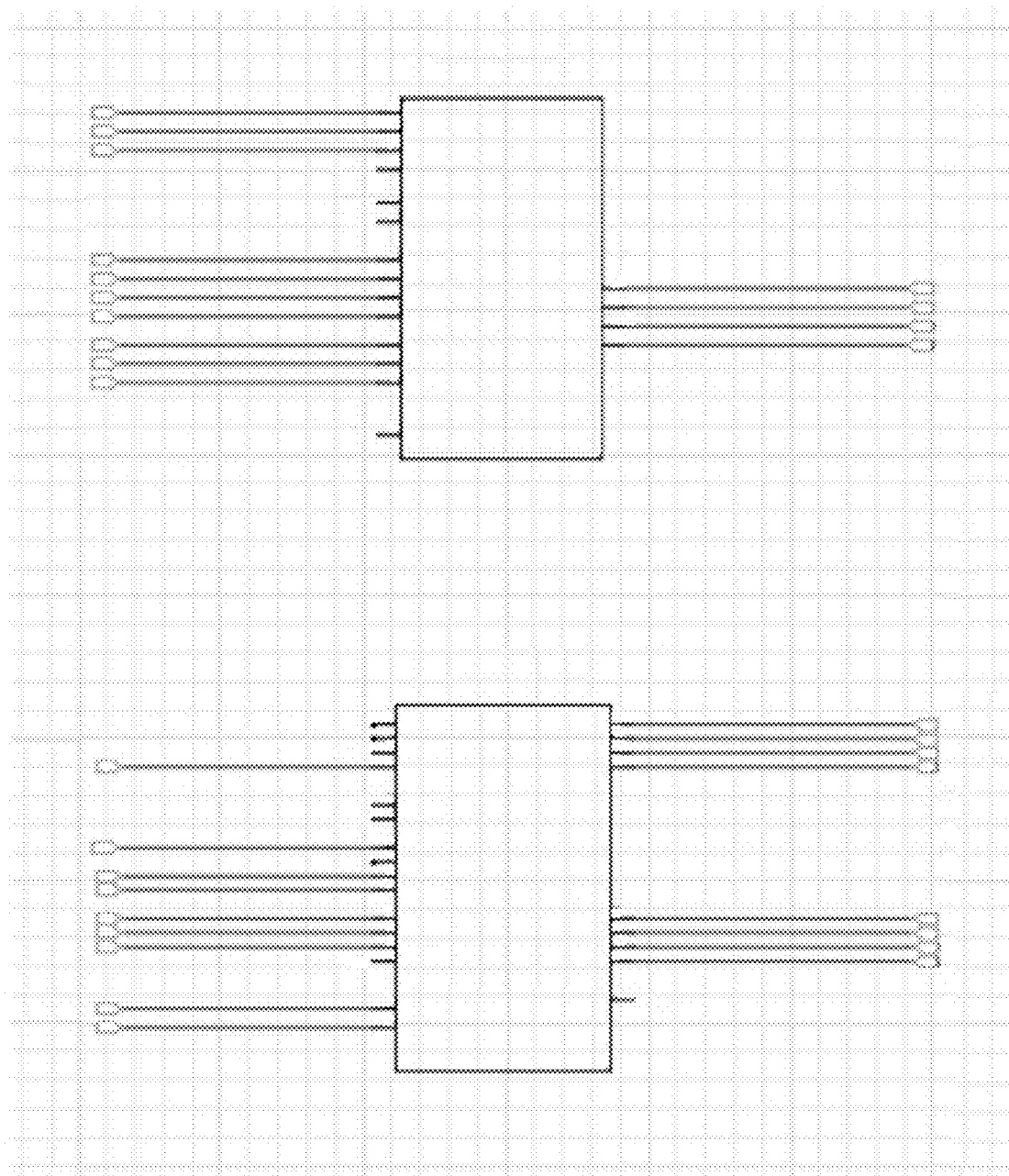

Referring now to FIGS. 10-16, an example showing a manual process such as those from existing approaches is provided. In this example, the user's intent is to change the color of all wires to red, excluding buses and netgroups and all other objects on the page. The first step may involve selecting all objects on the page as shown in FIGS. 10-11. The user may then apply a filter on wires only as shown in FIGS. 12-13, which depict clearing all filters and selecting the wires. FIGS. 14-16 depict manual mouse operations that the user may need to locate and select in order to complete the command. For example, the user must select the desired color and change the color to red.

Figure 17:
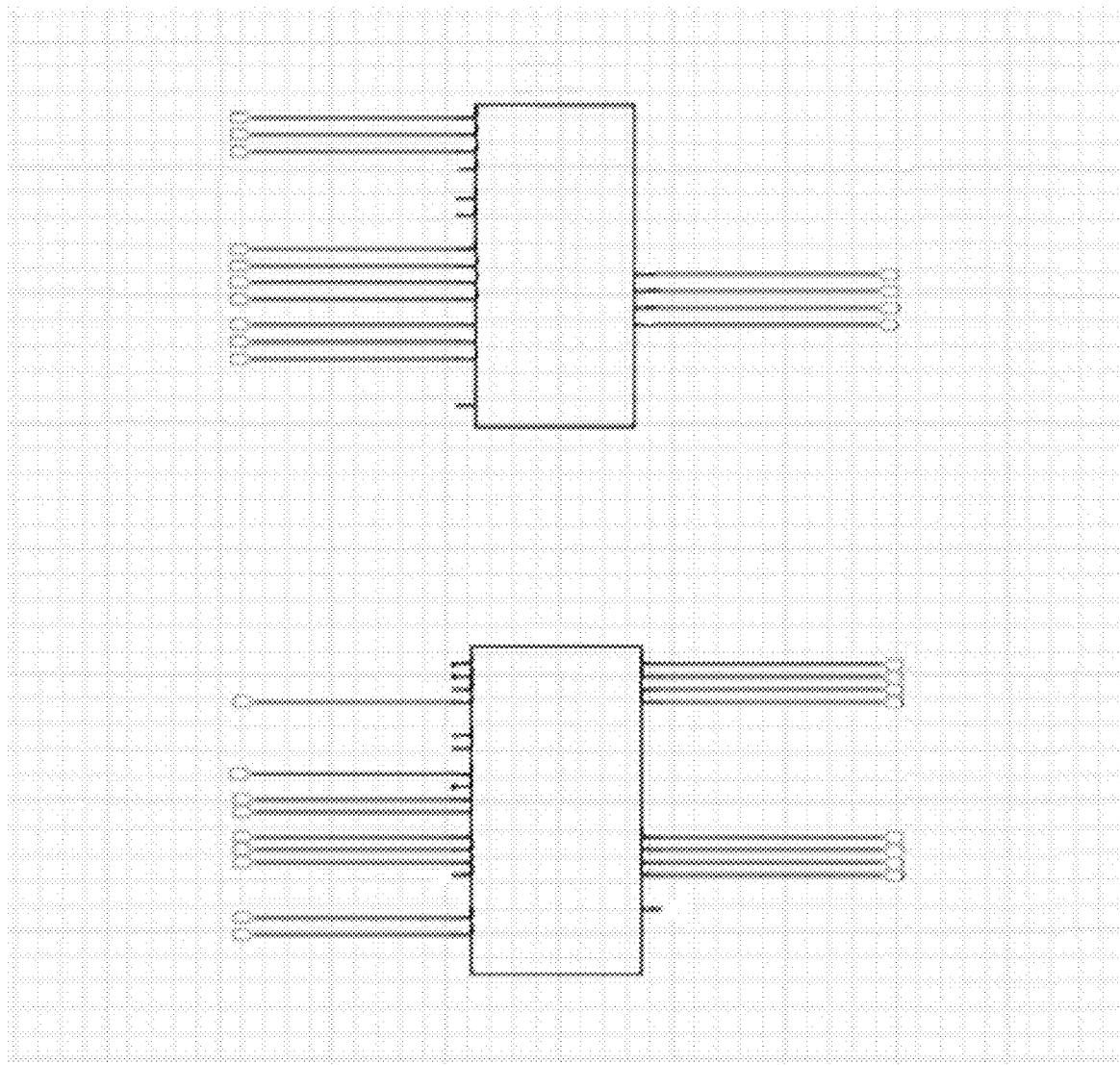
FIGS. 17-18 show graphical user interfaces showing examples associated with an intent recognition process according to an embodiment of the present disclosure.
Figure 18:
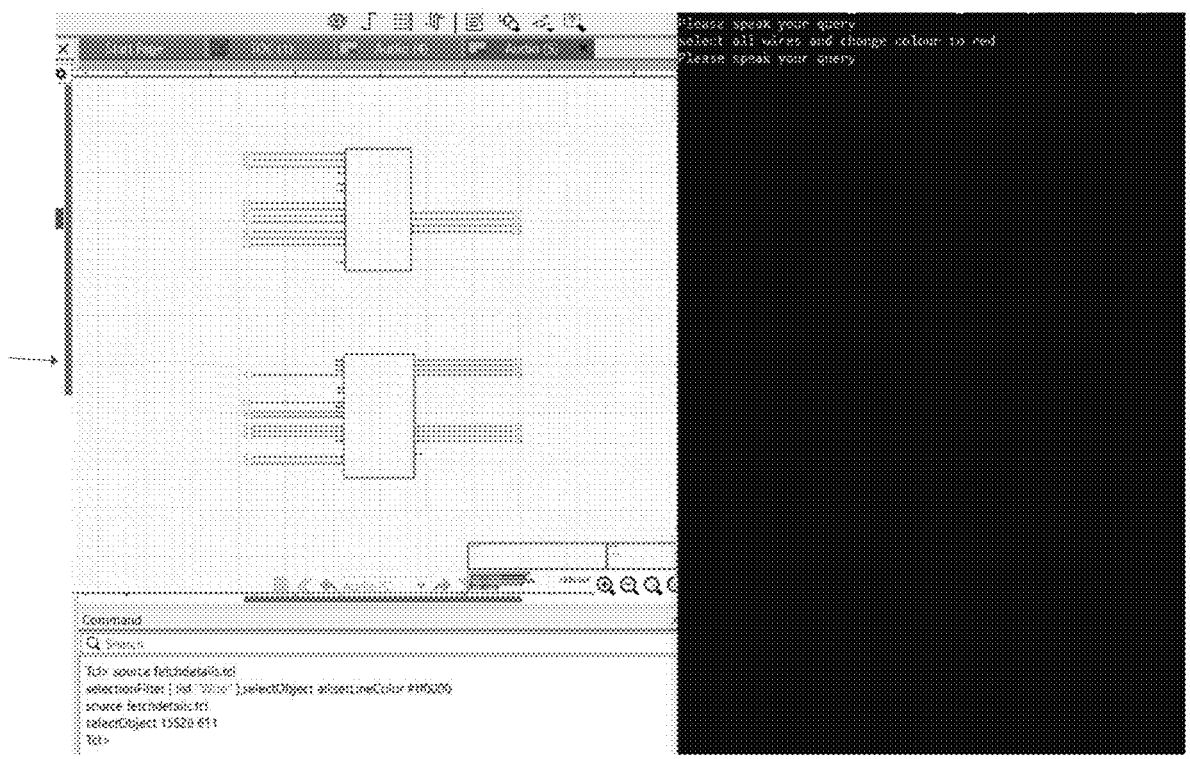

In contrast, FIGS. 17-18 display embodiments consistent with intent recognition process 10. In this example, the initial graphical user interface is displayed in FIG. 17 having wires that are blue in color and the final display is shown in FIG. 18. GUI 1800 may display a prompt to the user asking them to "please speak your query". Additionally and/or alternatively, the prompt may be an audio prompt or via any other suitable approach. In operation, intent recognition process 10 may receive the voice input "select all wires and change color to red" from the user with the resultant red wires displayed in FIG. 18 after execution of the command.

Figure 19:
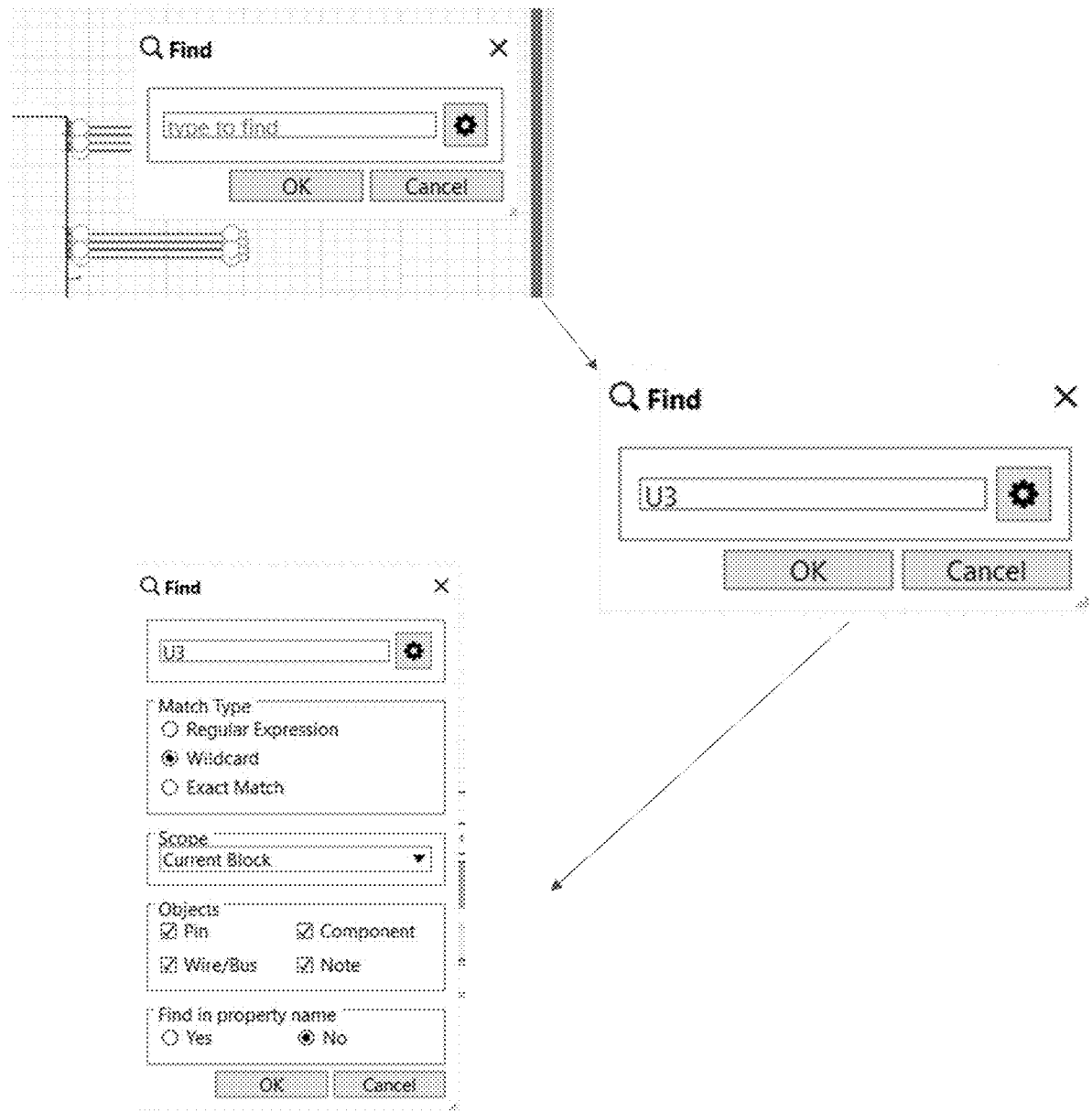
FIGS. 19-21 show examples of graphical user interfaces consistent with manual processes.
Figure 20:
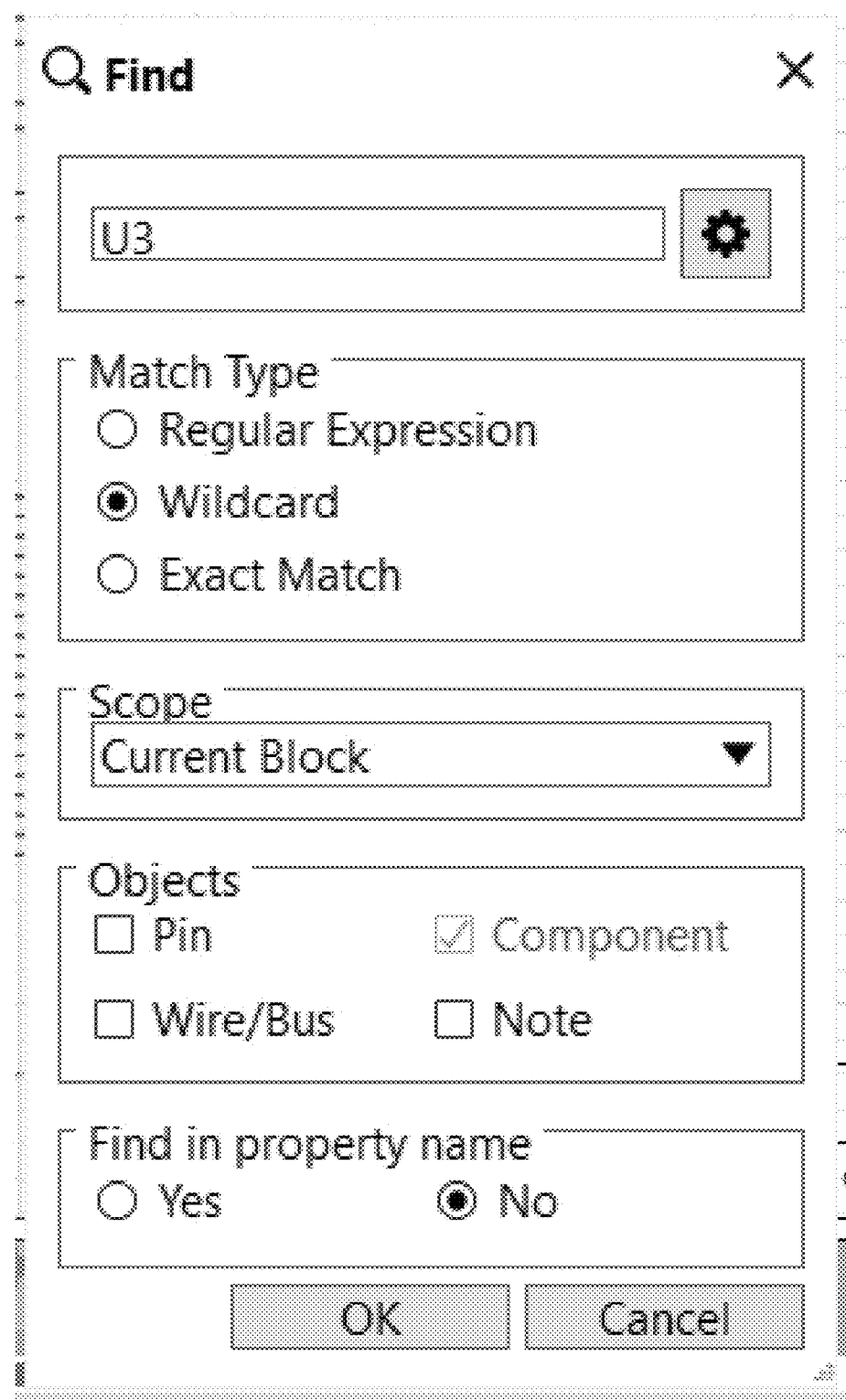
Figure 21:
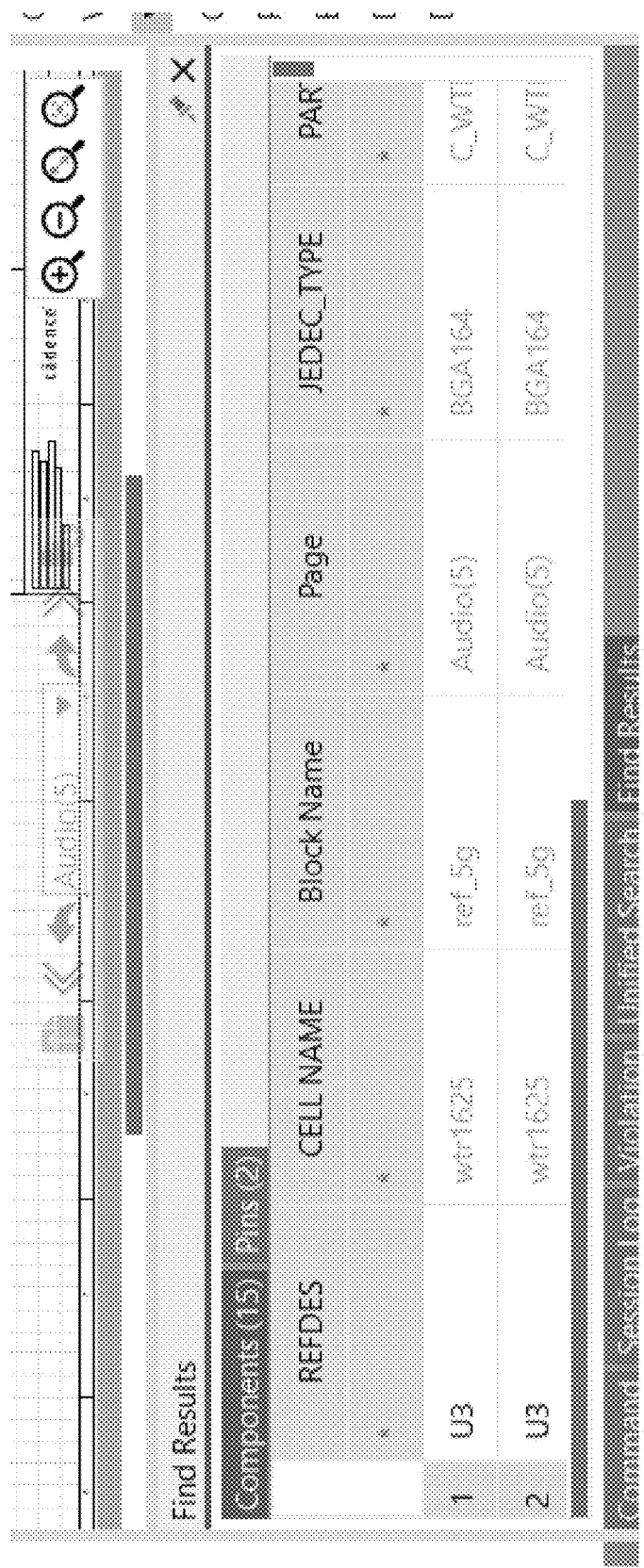

Referring now to FIGS. 19-21 an example showing a manual process such as those from existing approaches is provided. In this example, the user's intent is to find objects, specifically, in this case, to find all components with "U3 RefDes" in the electronic design. As shown in FIG. 19, the user must launch the find window, enter text "U3", and click on gear to enable only the component search. As shown in FIG. 20, the user must then manually uncheck all objects except the component and then select "OK" in FIG. 21 to see the search results.

Figure 22:
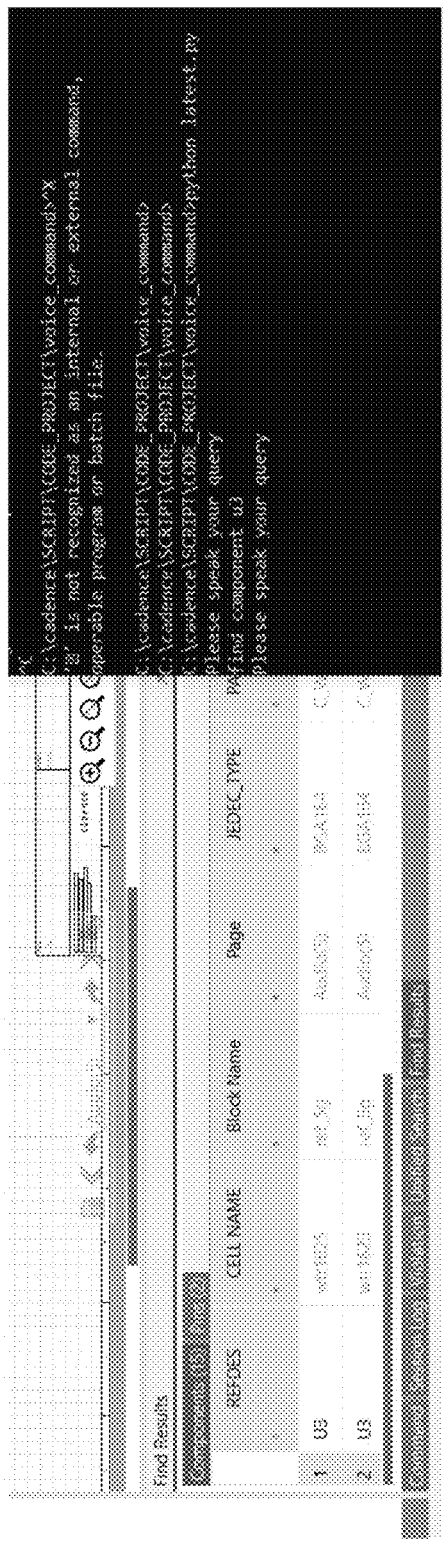
FIG. 22 shows a graphical user interface depicting an example associated with an intent recognition process according to an embodiment of the present disclosure.

In contrast, FIG. 22 depicts a graphical user interface 2200 showing embodiments consistent with intent recognition process 10. GUI 2200 may display a prompt to the user asking them to "please speak your query". In operation, intent recognition process 10 may receive the voice input "find component U3" from the user with the resultant components displayed in the left portion of GUI 2200 after execution of the command.

Figure 23:
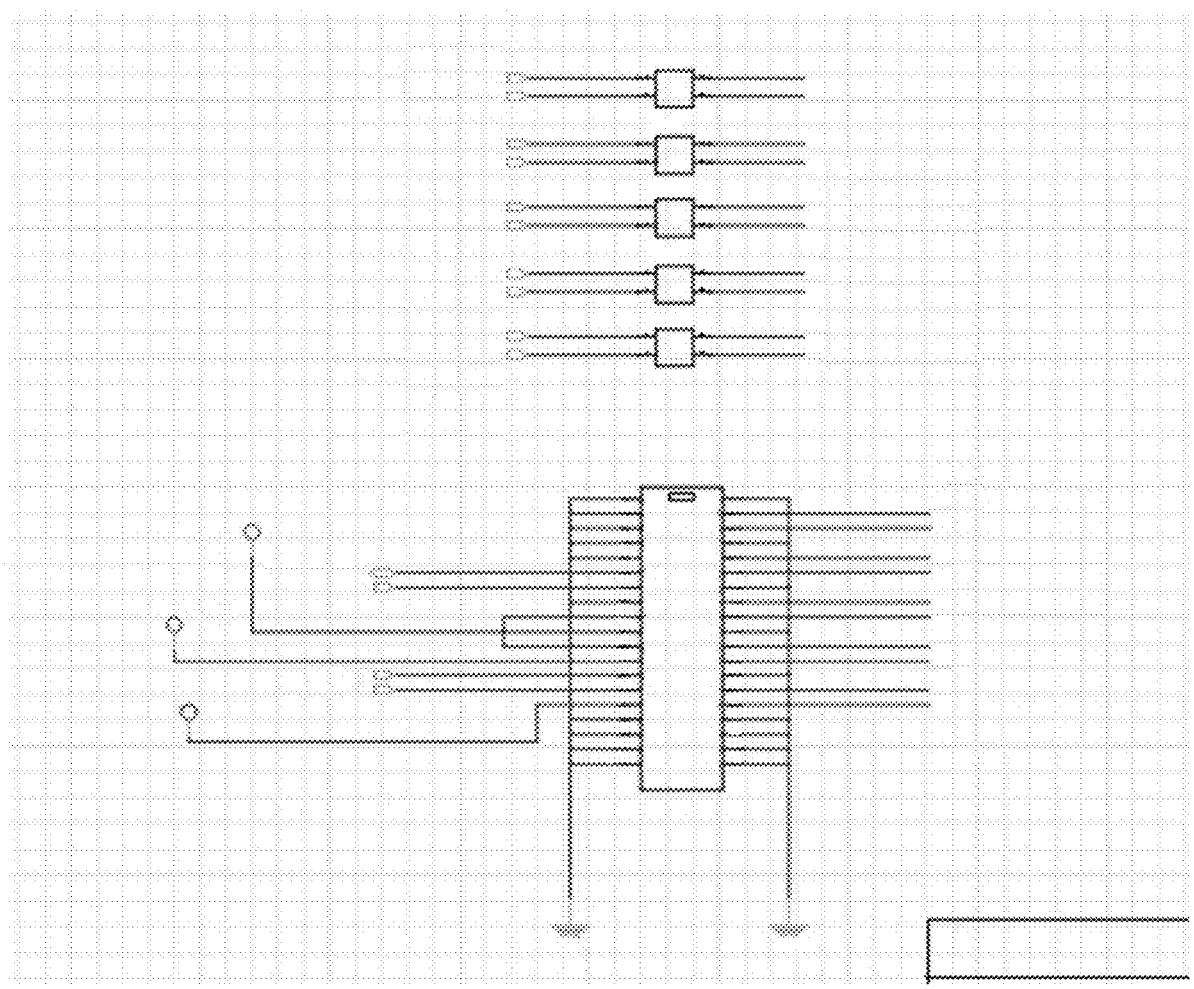
Figure 24:
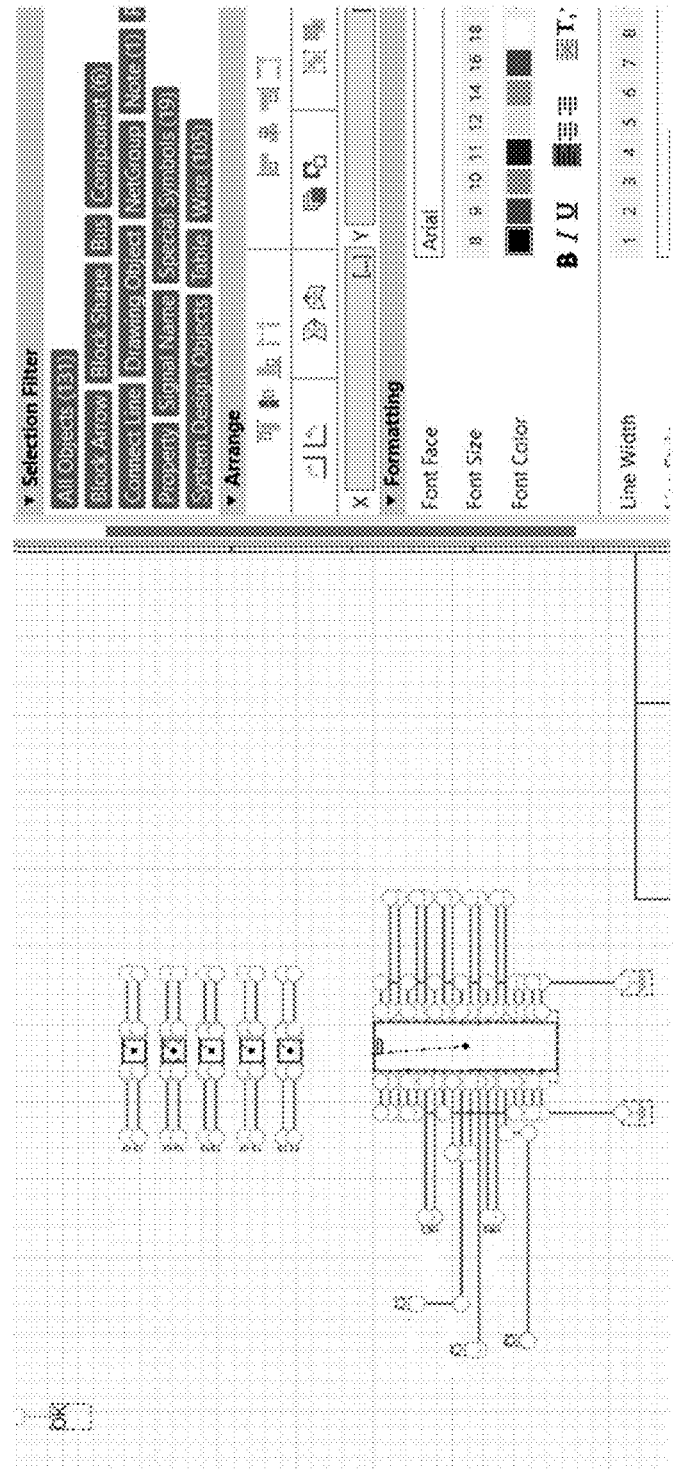
Figure 25:
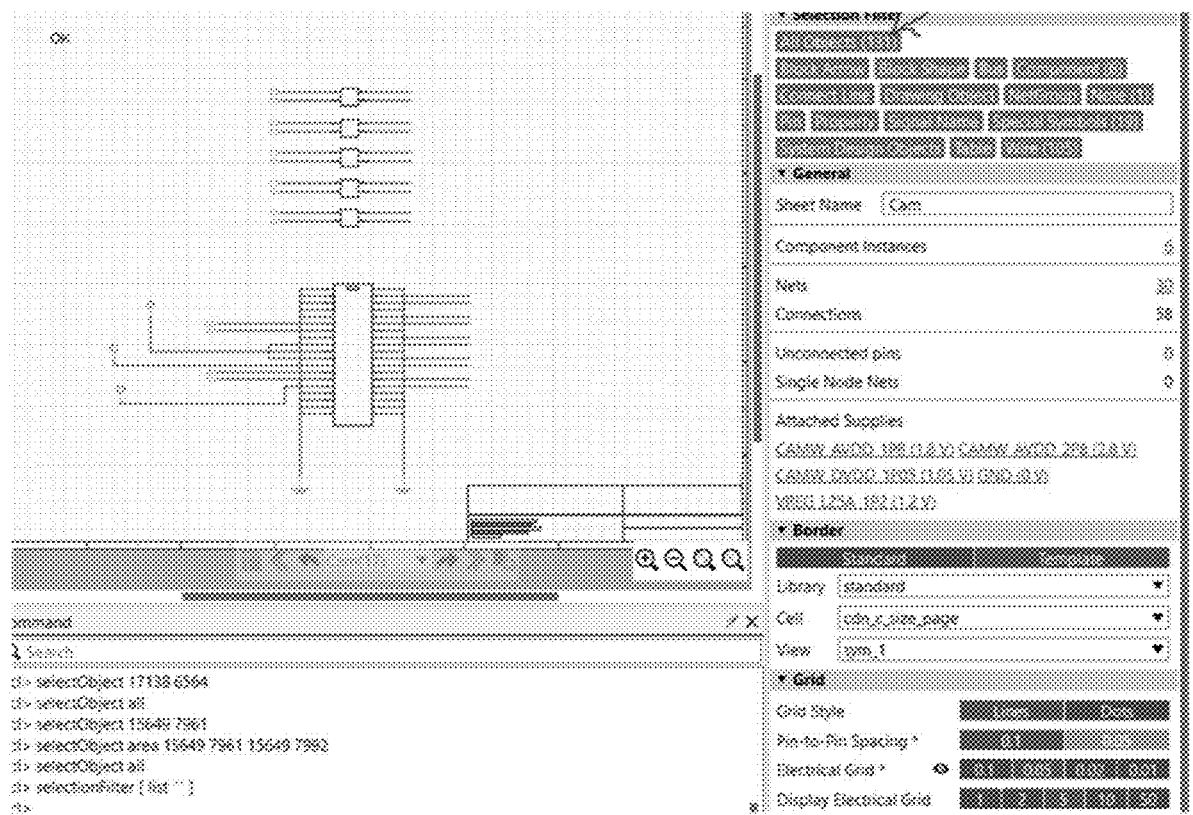
Figure 26:
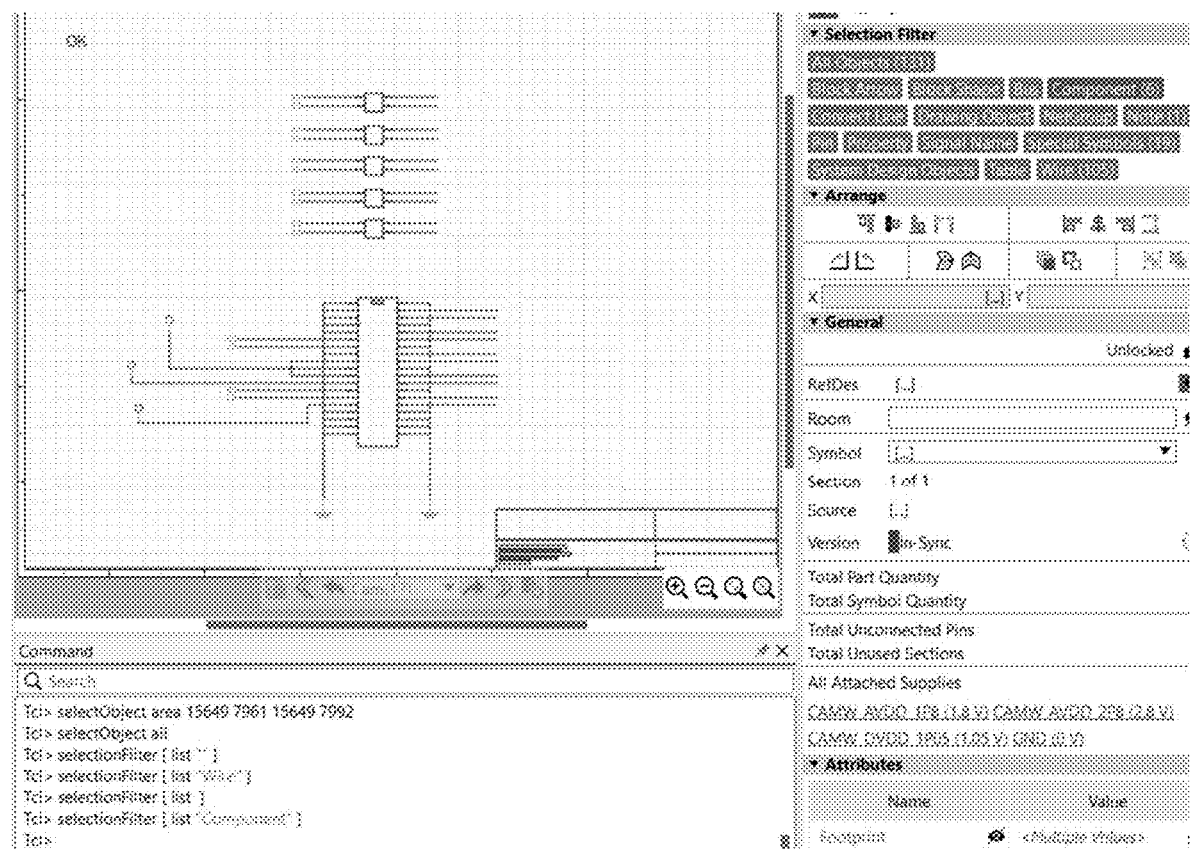
Figure 27:
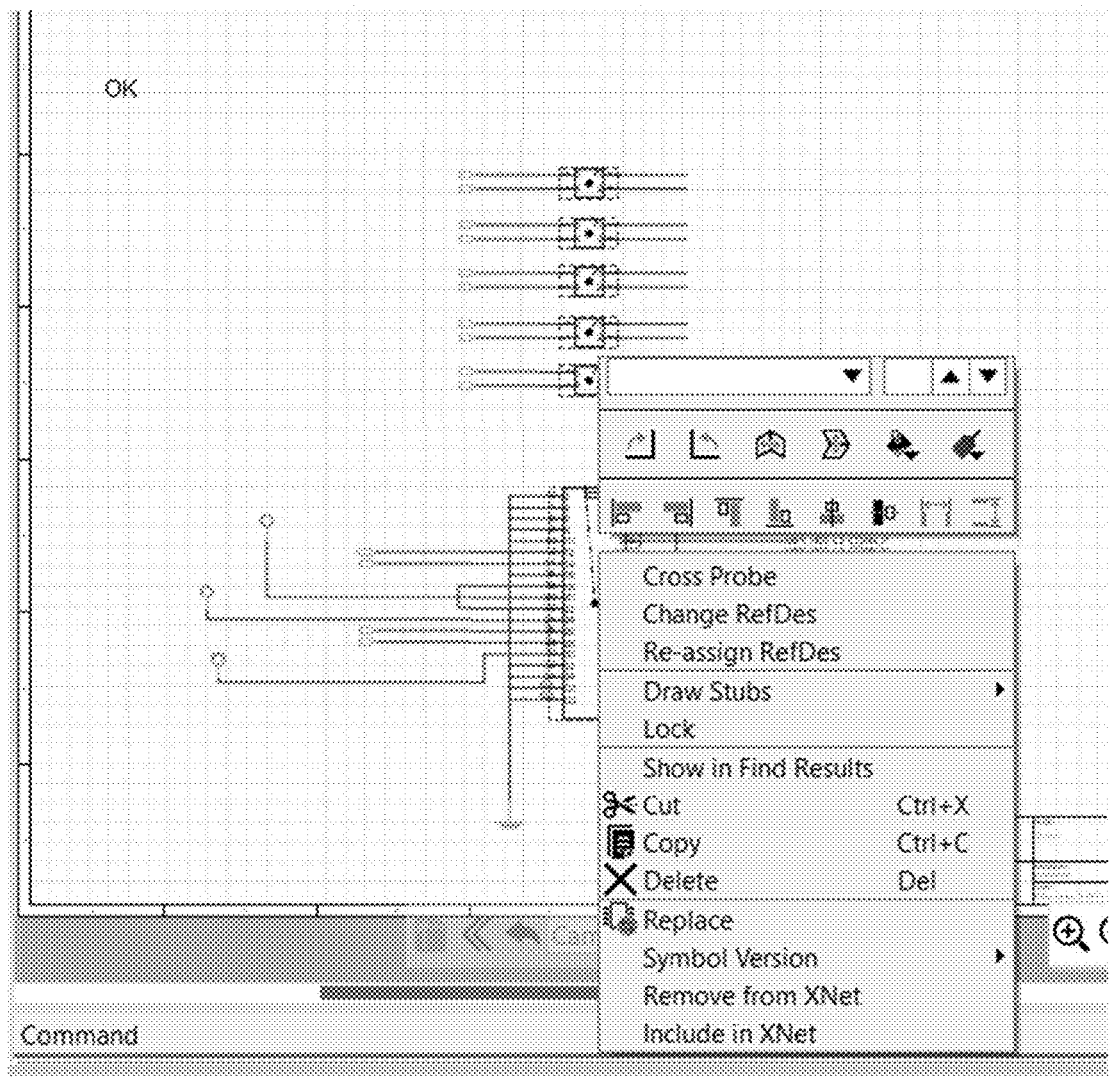
Figure 28:
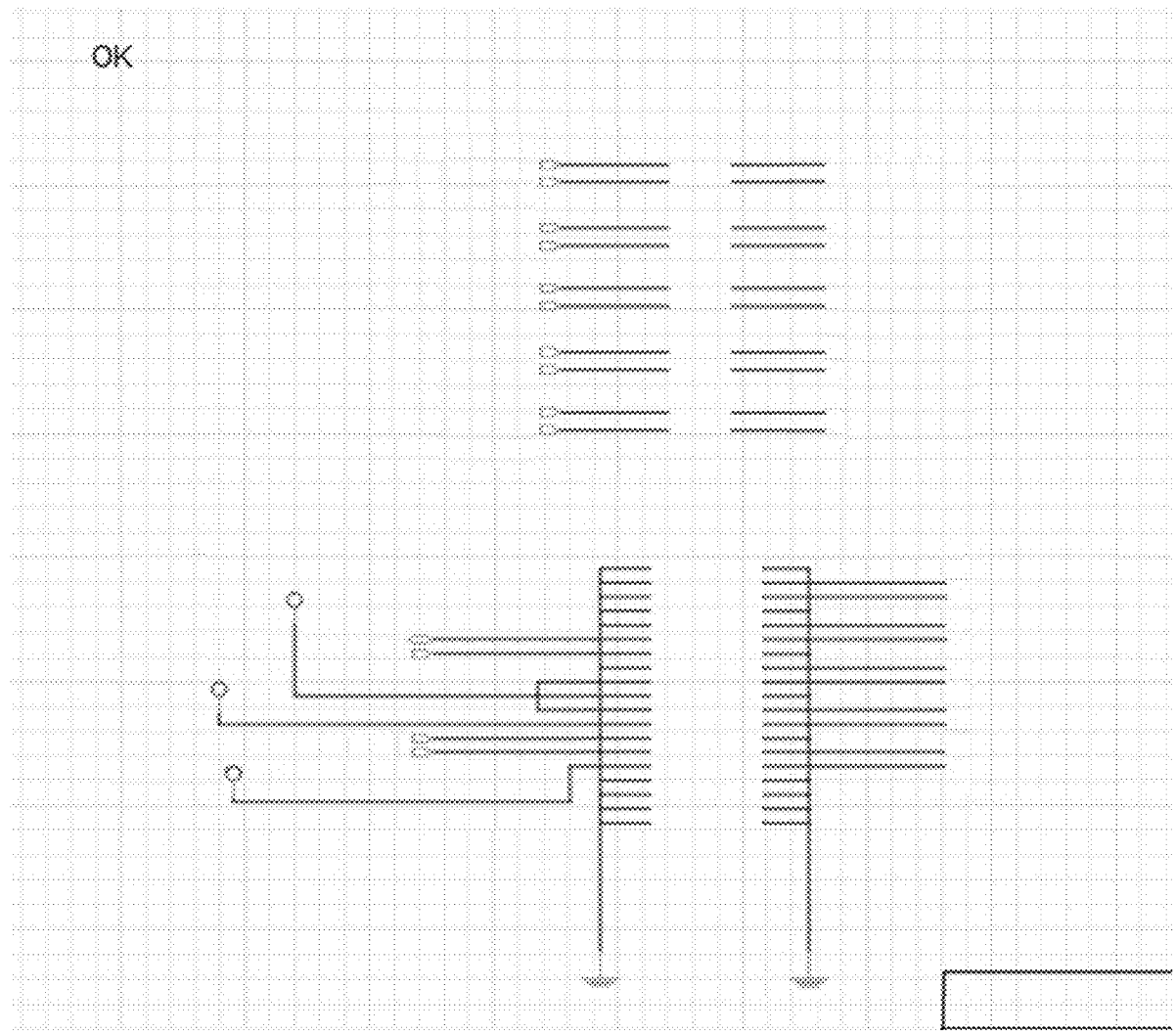

Referring now to FIGS. 23-29 an example showing a manual process such as those from existing approaches is provided. In this example, the user's intent is to delete all components on a page. FIGS. 23-24 depict graphical user interfaces that may allow the user to manually select all of the objects on a page. The user may then apply a filter on components only as shown in FIGS. 25-26, where all filters may be cleared and the desired components selected. FIGS. 27-28 depict graphical user interfaces that may allow the user to manually select what he/she wishes to delete.

Figure 29:
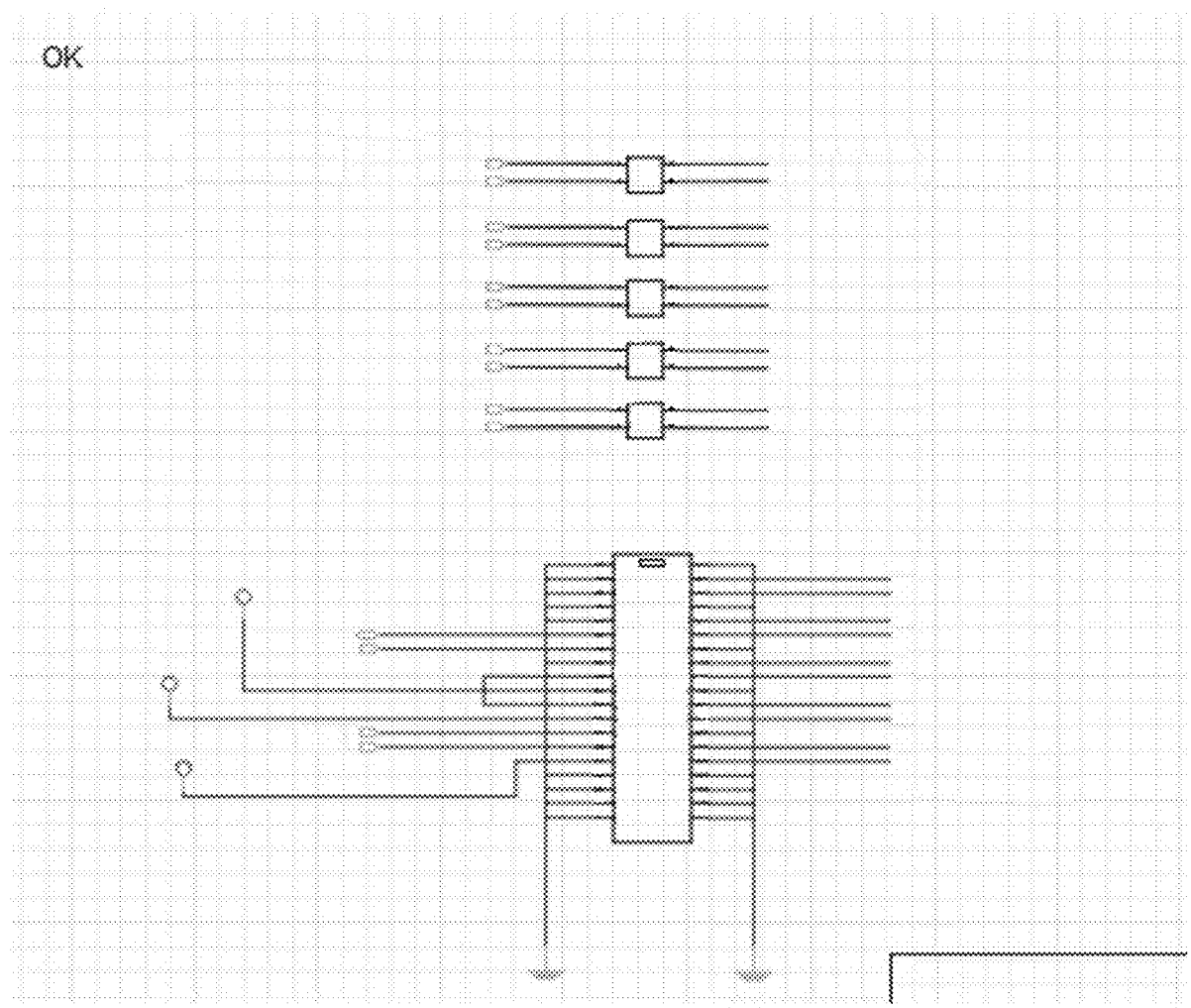
FIGS. 29-30 show graphical user interfaces depicting examples associated with an intent recognition process according to an embodiment of the present disclosure.
Figure 30:
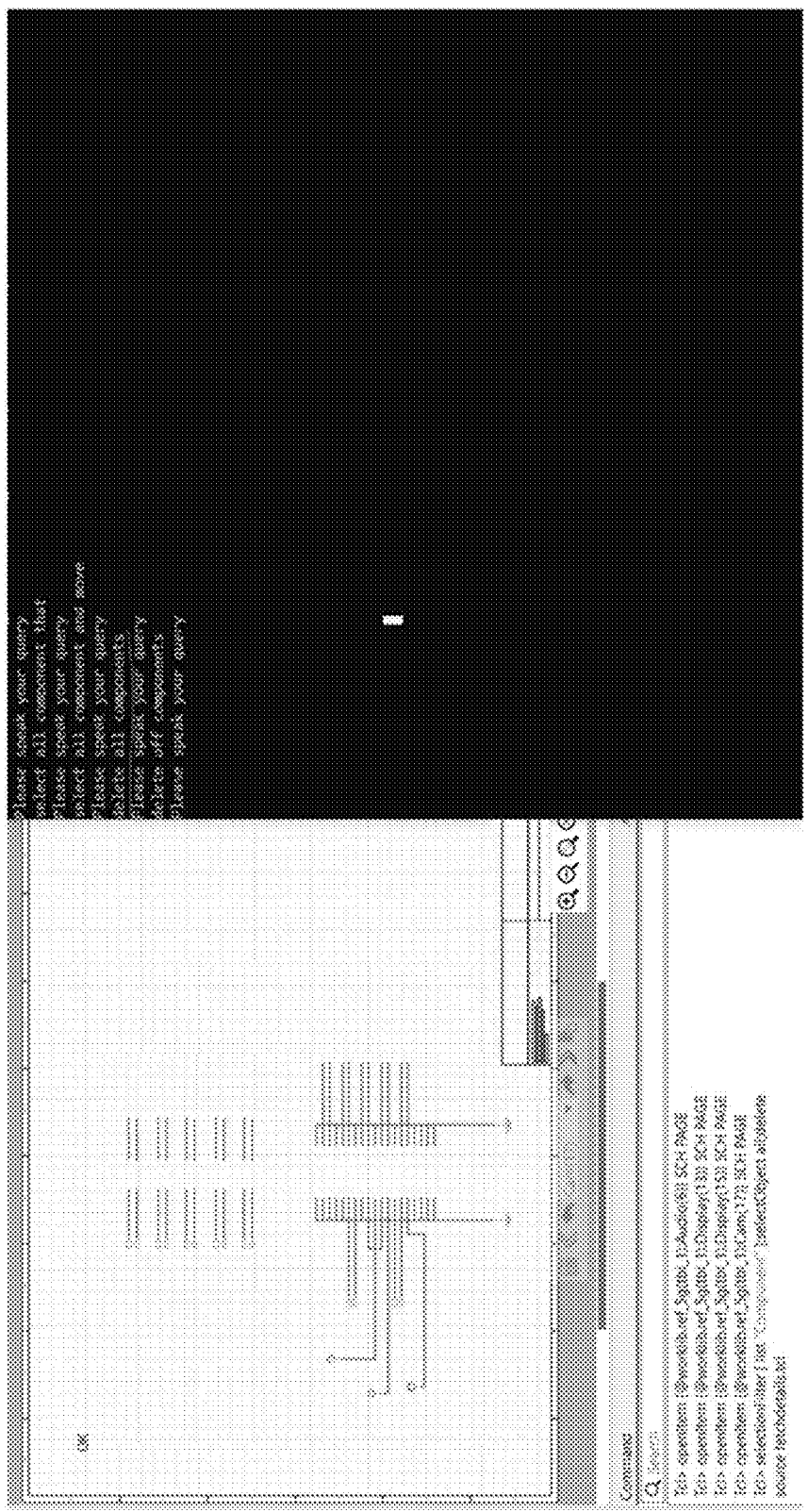

In contrast, FIGS. 29-30 depicts graphical user interfaces 2900, 3000 showing embodiments consistent with intent recognition process 10. GUI 2900 shows the initial electronic design and GUI 3000 may display a prompt to the user asking them to "please speak your query". In operation, intent recognition process 10 may receive the voice input "delete all components" from the user with the resultant design with components deleted displayed in the left portion of GUI 3000 after execution of the command.

Embodiments of intent recognition process 10 described herein provide a new approach to provide intent recognition from a natural language input, and then generate and execute the sequence of operations to achieve the intent. Embodiments may provide intent recognition with context aware intelligence and language construct intelligence and a command. generator may generate one or more commands from the recognized intents. Embodiments included herein provide a scalable and extensible solution for multiple tools and design environments including various cloud environments.

Embodiments of intent recognition process 10 provide ease of use for new and advance users as significant time and effort is reduced in learning and remembering tool specific complex terminology and commands. Embodiments may scale well for next generation cloud environments such as for PCB and IC domains due to its decoupled architecture and method.

Embodiments included herein may employ multi-dimensional intelligence methods to determine the intent. The process may include a decoupled set of methods that may be deployed across multiple environments—even from a desktop machine to a cloud.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method for use in an electronic design process comprising:
   receiving, using a processor associated with an electronic design application, a natural language input from a user at an intent recognition model;
   performing intent recognition on the natural language input at the intent recognition model;
   providing an output from the intent recognition model to a command generator;
   generating a design command based upon, at least in part, the output; and
   executing the design command at a target tool environment.

2. The method of claim 1, further comprising:
   receiving training data at a learning and classification model.

3. The method of claim 2, further comprising:
   providing an output from the learning and classification model to the intent recognition model.

4. The method of claim 1, wherein the intent recognition model includes an intent classifier.

5. The method of claim 1, wherein the intent recognition model includes an intent entity mapper.

6. The method of claim 1, wherein the command generator includes a generic command mapper.

7. The method claim 1, wherein the command generator includes a tool specific command sequencer and executor.

8. The method of claim 1, further comprising:
   providing feedback from the target tool environment back to a user's computing device.

9. The method claim 1, further comprising:
   providing feedback from the intent recognition model to the learning and classification model.

10. The method of claim 1, wherein the natural language input is at least one of a speech input and a textual input.

11. A system for electronic design comprising:
    at least one processor configured to receive a natural language input from a user at an intent recognition model, the at least one processor further configured to perform intent recognition on the natural language input at the intent recognition model, the at least one processor further configured to provide an output from the intent recognition model to a command generator, the at least one processor further configured to generate a design command based upon, at least in part, the output, the at least one processor further configured to execute the design command at a target tool environment.

12. The system of claim 11, wherein the at least one processor is further configured to receive training data at a learning and classification model.

13. The system of claim 12, wherein the at least one processor is further configured to provide an output from the learning and classification model to the intent recognition model.

14. The system of claim 11, wherein the intent recognition model includes an intent classifier.

15. The system of claim 11, wherein the intent recognition model includes an intent entity mapper.

16. The system of claim 11, wherein the command generator includes a generic command mapper.

17. The system claim 11, wherein the command generator includes a tool specific command sequencer and executor.

18. The system of claim 11, wherein the at least one processor is further configured to provide feedback from the target tool environment back to a user's computing device.

19. The system claim 11, wherein the at least one processor is further configured to provide feedback from the intent recognition model to the learning and classification model.

20. The system of claim 11, wherein the natural language input is at least one of a speech input and a textual input.

\* \* \* \* \*